United States Patent
Kusayanagi et al.

(10) Patent No.: US 10,204,799 B2
(45) Date of Patent: Feb. 12, 2019

(54) METHOD FOR MANUFACTURING A FIELD-EFFECT TRANSISTOR

(71) Applicants: Minehide Kusayanagi, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP)

(72) Inventors: Minehide Kusayanagi, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/376,895

(22) Filed: Dec. 13, 2016

(65) Prior Publication Data
US 2017/0186626 A1 Jun. 29, 2017

(30) Foreign Application Priority Data
Dec. 15, 2015 (JP) ................................. 2015-244316
Nov. 17, 2016 (JP) ................................. 2016-224441

(51) Int. Cl.
*H01L 21/44* (2006.01)
*H01L 29/24* (2006.01)
(Continued)

(52) U.S. Cl.
CPC ............ *H01L 21/44* (2013.01); *H01L 21/477* (2013.01); *H01L 29/24* (2013.01); *H01L 29/45* (2013.01);
(Continued)

(58) Field of Classification Search
None
See application file for complete search history.

(56) References Cited

U.S. PATENT DOCUMENTS 5,985,513 A * 11/1999 Kani ......................... C08K 5/14
                                                      430/270.1
9,112,039 B2 * 8/2015 Ueda .................... H01L 27/1225
(Continued)

FOREIGN PATENT DOCUMENTS

JP         02012796 A  *  1/1990
JP      2007123861 A  *  5/2007

OTHER PUBLICATIONS

Je-hun Lee et al., "World's Largest (15 inch) XGA AMLCD Panel Using IGZO Oxide TFT", LCD Business, Samsung Electronics Co., LTD, Samsung Advanced Institute of Technology, Display Device & Processing Lab., SID 08 Digest, 42-2, pp. 625 to 628.

*Primary Examiner* — David E Graybill
(74) *Attorney, Agent, or Firm* — Cooper & Dunham LLP

(57) ABSTRACT

A method for manufacturing a field-effect transistor includes forming an active layer of an oxide semiconductor, forming a conducting film to cover the active layer, patterning the conducting film through an etching process using an etchant to form a source electrode and a drain electrode, and performing, at least before the patterning the conducting film, a treatment on the active layer so that an etching rate of the active layer is less than an etching rate of the conducting film.

15 Claims, 13 Drawing Sheets

| | Active Layer Sputter Target | Process | Conducting Film | Etchant of Conducting Film | Presence of Active Layer Pattern |
|---|---|---|---|---|---|
| Ex. 1-1 | $Mg_{0.35}Al_{0.01}In_2O_4$ | oven heating, in atmosphere, 350 °C, 1 h | Al | PAN based | YES |
| Ex. 1-2 | $Mg_{2.7}Zn_{0.3}In_{1.39}W_{0.01}O_4$ | oven heating, in atmosphere, 450 °C, 1 h | Al/Mo | PAN based | YES |
| Ex. 1-3 | $Mg_{2.15}Zn_{0.85}O$ | oven heating, in atmosphere, 400 °C, 1 h | Mo/Ti | PAN based/ hydrofluoric acid based | YES |
| Ex. 1-4 | $CaSn_{0.02}Sb_{0.38}O_3$ | oven heating, in atmosphere, 300 °C, 1 h | ITO(Sn10wt%)/Mo | oxalic acid based/ PAN based | YES |
| Ex. 1-5 | $Ca_{0.15}Ti_{0.85}O_3$ | oven heating, in atmosphere, 400 °C, 1 h | AlSi (Si0.5wt%) | PAN based | YES |
| Ex. 1-6 | $Ba_{0.15}Ti_{0.83}Nb_{0.02}O_3$ | oven heating, in atmosphere, 400 °C, 1 h | MoW/Ti | PAN based/ hydrofluoric acid based | YES |
| Ex. 1-7 | $La_{0.6}In_{1.4}O_3$ | oven heating, in atmosphere, 350 °C, 1 h | MoW | PAN based | YES |
| Ex. 1-8 | $Zn_2Ti_{0.39}Nb_{0.01}O_4$ | oven heating, in atmosphere, 400 °C, 1 h | ITO(Sn10wt%) | oxalic acid based | YES |
| Ex. 1-9 | $Zn_{0.99}Mo_{0.01}In_2O_4$ | oven heating, in atmosphere, 450 °C, 1 h | Al/Mo/Ti | organic alkali based/PAN based/ hydrofluoric acid based | YES |
| Ex. 1-10 | $Zn_2Sn_{0.99}Ta_{0.01}O_4$ | oven heating, in atmosphere, 400 °C, 1 h | Ti | hydrofluoric acid based | YES |
| Ex. 1-11 | $Cd_{0.9}Al_{2.1}O_4$ | oven heating, in atmosphere, 500 °C, 1 h | ITO(Sn10wt%) | oxalic acid based | YES |
| Ex. 1-12 | $Hf_{0.3}Sr_{0.2}In_{1.5}O_3$ | oven heating, in atmosphere, 400 °C, 1 h | Mo/Al | PAN based | YES |
| Ex. 1-13 | $MgIn_{0.4}Ga_{0.19}Mo_{0.01}O_4$ | excimer laser irradiation (λ: 248 nm) 500 mJ/cm² | Al/Mo/Ti | organic alkali based/PAN based/ hydrofluoric acid based | YES |
| Ex. 1-14 | $Gd_{0.5}In_{1.39}Sn_{0.01}O_3$ | excimer laser irradiation (λ: 248 nm) 500 mJ/cm² | Al | PAN based | YES |
| Ex. 1-15 | $Zr_{0.2}Sn_{1.2}In_{1.6}O_3$ | Nd-YAG laser irradiation (4 fold wave λ: 266 nm) 500 mJ/cm² | Mo | PAN based | YES |
| Ex. 1-16 | $In_{0.75}Ga_{1.2}Sn_{0.05}O_3$ | Nd-YAG laser irradiation (4 fold wave λ: 266 nm) 500 mJ/cm² | Al/Mo/Ti | organic alkali based/PAN based/ hydrofluoric acid based | YES |
| Comp. Ex. 1-1 | $Mg_{0.99}Al_{0.01}In_2O_4$ | none | Al | PAN based | NO |
| Comp. Ex. 1-2 | $La_{0.6}In_{1.4}O_3$ | none | MoW | PAN based | NO |

(51) Int. Cl.
*H01L 29/45* (2006.01)
*H01L 29/66* (2006.01)
*H01L 21/477* (2006.01)
*H01L 29/786* (2006.01)

(52) U.S. Cl.
CPC .... *H01L 29/66969* (2013.01); *H01L 29/7869* (2013.01)

(56) References Cited

U.S. PATENT DOCUMENTS

| | | | |
|---|---|---|---|
| 9,418,842 B2* | 8/2016 | Nakamura | H01L 29/7869 |
| 2010/0123132 A1* | 5/2010 | Nakata | H01L 29/7869 257/43 |
| 2014/0170809 A1* | 6/2014 | Yamazaki | H01L 21/4757 438/104 |
| 2014/0353648 A1* | 12/2014 | Abe | H01L 29/247 257/40 |
| 2015/0028334 A1* | 1/2015 | Matsumoto | H01L 23/5328 257/43 |
| 2015/0349138 A1* | 12/2015 | Sone | H01L 29/7869 345/206 |
| 2016/0013215 A1* | 1/2016 | Ueda | C09D 5/24 345/204 |
| 2016/0042947 A1* | 2/2016 | Nakamura | H01L 29/66969 257/43 |
| 2016/0190329 A1* | 6/2016 | Matsumoto | H01L 29/66969 345/55 |
| 2016/0267873 A1* | 9/2016 | Saotome | H01L 29/7869 |

* cited by examiner

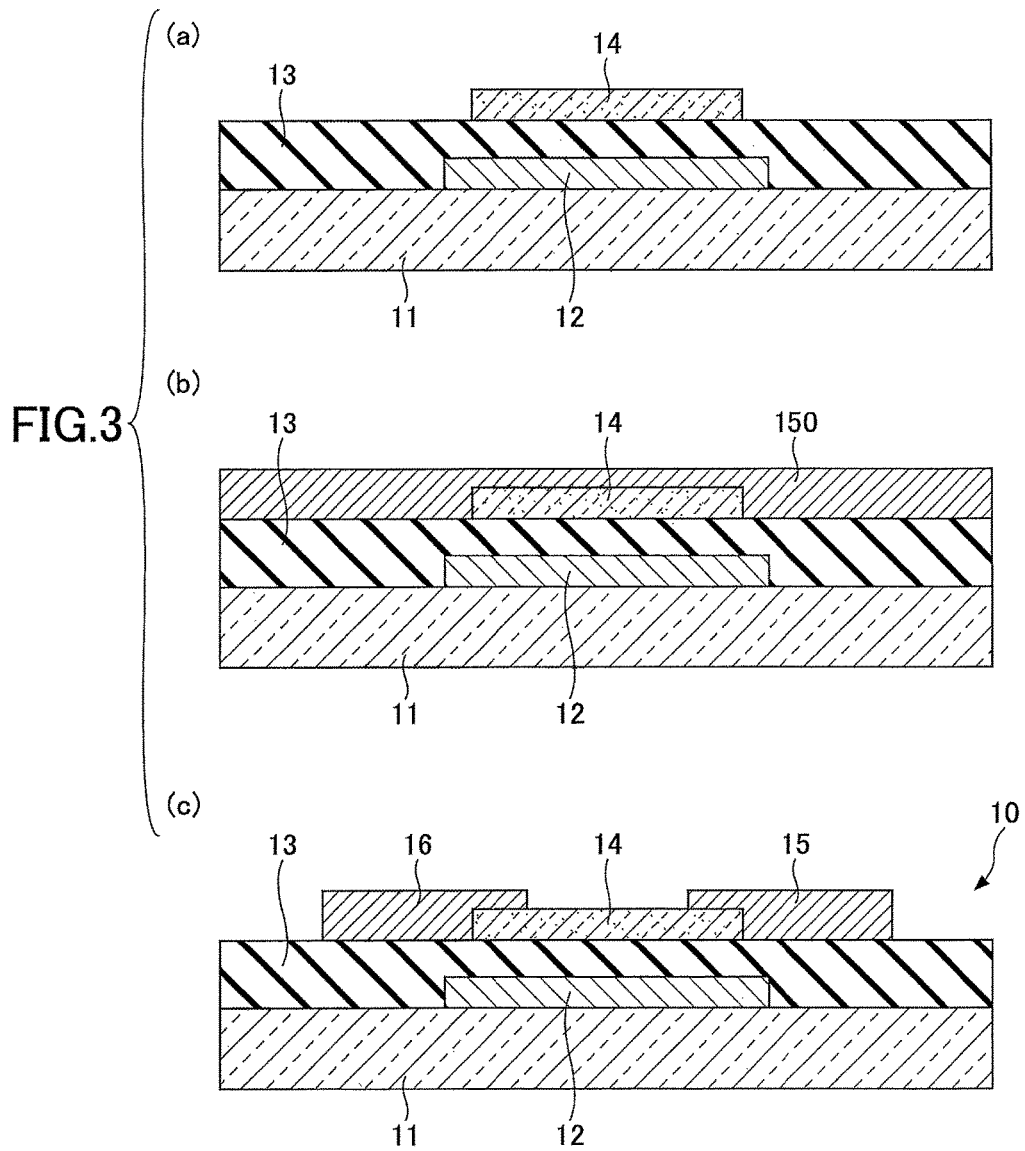
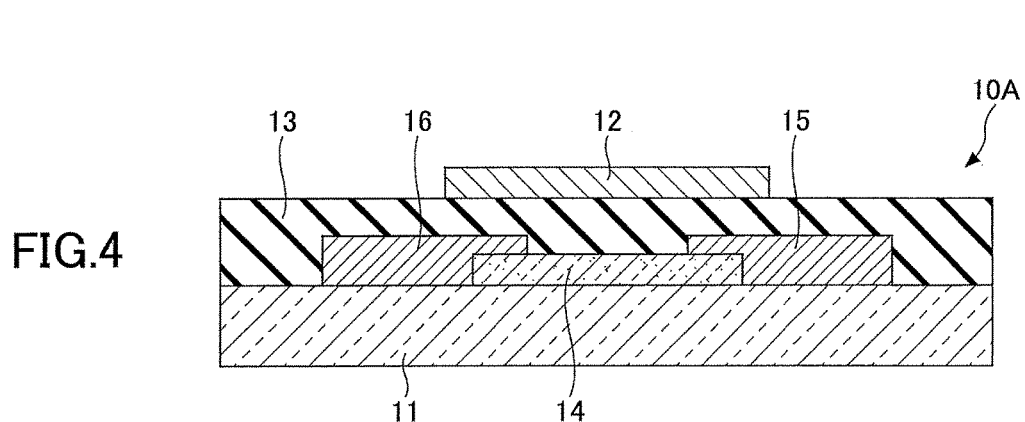

FIG.5

| | Active Layer Sputter Target | Process | Conducting Film | Etchant of Conducting Film | Presence of Active Layer Pattern |
|---|---|---|---|---|---|
| Ex. 1-1 | $Mg_{0.99}Al_{0.01}In_2O_4$ | oven heating, in atmosphere, 350 °C, 1 h | Al | PAN based | YES |
| Ex. 1-2 | $Mg_{0.7}Zn_{0.3}In_{1.99}W_{0.01}O_4$ | oven heating, in atmosphere, 450 °C, 1 h | Al/Mo | PAN based | YES |
| Ex. 1-3 | $Mg_{0.15}Zn_{0.85}O$ | oven heating, in atmosphere, 400 °C, 1 h | Mo/Ti | PAN based/ hydrofluoric acid based | YES |
| Ex. 1-4 | $CaSn_{0.02}Sb_{0.98}O_3$ | oven heating, in atmosphere, 300 °C, 1 h | ITO(Sn10wt%)/Mo | oxalic acid based/ PAN based | YES |
| Ex. 1-5 | $Ca_{0.15}Ti_{0.85}O_3$ | oven heating, in atmosphere, 400 °C, 1 h | AlSi (Si0.5wt%) | PAN based | YES |
| Ex. 1-6 | $Ba_{0.15}Ti_{0.83}Nb_{0.02}O_3$ | oven heating, in atmosphere, 400 °C, 1 h | MoW/Ti | PAN based/ hydrofluoric acid based | YES |
| Ex. 1-7 | $La_{0.6}In_{1.4}O_3$ | oven heating, in atmosphere, 350 °C, 1 h | MoW | PAN based | YES |
| Ex. 1-8 | $Zn_2Ti_{0.99}Nb_{0.01}O_4$ | oven heating, in atmosphere, 400 °C, 1 h | ITO(Sn10wt%) | oxalic acid based | YES |
| Ex. 1-9 | $Zn_{0.99}Mo_{0.01}In_2O_4$ | oven heating, in atmosphere, 450 °C, 1 h | Al/Mo/Ti | organic alkali based/PAN based/ hydrofluoric acid based | YES |
| Ex. 1-10 | $Zn_2Sn_{0.99}Ta_{0.01}O_4$ | oven heating, in atmosphere, 400 °C, 1 h | Ti | hydrofluoric acid based | YES |
| Ex. 1-11 | $Cd_{0.9}Al_2I_4O_4$ | oven heating, in atmosphere, 500 °C, 1 h | ITO(Sn10wt%) | oxalic acid based | YES |
| Ex. 1-12 | $Hf_{0.2}Sr_{0.2}In_{1.6}O_3$ | oven heating, in atmosphere, 400 °C, 1 h | Mo/Al | PAN based | YES |
| Ex. 1-13 | $MgIn_{0.8}Ga_{0.19}Mo_{0.01}O_4$ | excimer laser irradiation ($\lambda$: 248 nm) 500 mJ/cm² | Al/Mo/Ti | organic alkali based/PAN based/ hydrofluoric acid based | YES |
| Ex. 1-14 | $Gd_{0.6}In_{1.39}Sn_{0.01}O_3$ | excimer laser irradiation ($\lambda$: 248 nm) 500 mJ/cm² | Al | PAN based | YES |
| Ex. 1-15 | $Zr_{0.2}Sr_{0.2}In_{1.6}O_3$ | Nd-YAG laser irradiation (4 fold wave $\lambda$: 266 nm) 500 mJ/cm² | Mo | PAN based | YES |
| Ex. 1-16 | $In_{0.78}Ga_{1.2}Sn_{0.02}O_3$ | Nd-YAG laser irradiation (4 fold wave $\lambda$: 266 nm) 500 mJ/cm² | Al/Mo/Ti | organic alkali based/PAN based/ hydrofluoric acid based | YES |
| Comp. Ex. 1-1 | $Mg_{0.99}Al_{0.01}In_2O_4$ | none | Al | PAN based | NO |
| Comp. Ex. 1-2 | $La_{0.6}In_{1.4}O_3$ | none | MoW | PAN based | NO |

|  | Coating Liquid No. | Material A | | | Material B | | | Material C | | | Solvent D | | Solvent E | |
|---|---|---|---|---|---|---|---|---|---|---|---|---|---|---|
|  |  | Kind | mmol | | Kind | mmol | | Kind | mmol | | Kind | mL | Kind | mL |
| Ex. 2-1 | 2-1 | $Y(C_8H_{15}O_2)_3 \cdot 6H_2O$ | 5 | | $In(C_8H_{15}O_2)_3$ | 99.8 | | $Ti(OBu)_4$ | 0.2 | | mesitylene | 800 | | |
| Ex. 2-2 | 2-2 | $Lu(NO_3)_3 \cdot 6H_2O$ | 6 | | $InCl_3 \cdot 4H_2O$ | 99.95 | | $W(CO)_6$ | 0.05 | | EGME | 420 | PG | 420 |
| Ex. 2-3 | 2-3 | $Ca(NO_3)_2 \cdot 4H_2O$ | 10 | | $In(NO_3)_3 \cdot 3H_2O$ | 100 | | $GeCl_4$ | 1 | | EGME | 200 | PG | 200 |
| Ex. 2-4 | 2-4 | $SrCl_2$ | 10 | | $In(NO_3)_3 \cdot 3H_2O$ | 100 | | $SnCl_2$ | 1 | | EGME | 200 | PG | 200 |
| Comp. Ex. 2-1 | 2-1 | $Y(C_8H_{15}O_2)_3 \cdot 6H_2O$ | 5 | | $In(C_8H_{15}O_2)_3$ | 99.8 | | $Ti(OBu)_4$ | 0.2 | | mesitylene | 800 | | |
| Comp. Ex. 2-2 | 2-2 | $Ca(NO_3)_2 \cdot 4H_2O$ | 10 | | $In(NO_3)_3 \cdot 3H_2O$ | 100 | | $GeCl_4$ | 1 | | EGME | 200 | PG | 200 |

Material A    $Y(C_8H_{15}O_2)_3 \cdot 6H_2O$ = yttrium 2-ethylhexanoate
               $Lu(NO_3)_3 \cdot 6H_2O$ = lutetium nitrate 6 hydrate
               $Ca(NO_3)_2 \cdot 4H_2O$ = calcium nitrate 4 hydrate
               $SrCl_2$ = strontium chloride Material B    $In(C_8H_{15}O_2)_3$ = indium 2-ethylhexanoate
               $InCl_3 \cdot 4H_2O$ = indium chloride 4 hydrate
               $In(NO_3)_3 \cdot 3H_2O$ = indium nitrate 3 hydrate Material C    $Ti(OBu)_4$ = titanium tetrabutoxide
               $W(CO)_6$ = tungsten hexacarbonyl
               $GeCl_4$ = germanium chloride
               $SnCl_2$ = tin chloride Solvent D    EGME = ethylene glycol monomethyl ether
Solvent E    PG = 1,2-propylene glycol

| | Process | Conducting Film | Etchant of Conducting Film | Presence of Active Layer Pattern |
|---|---|---|---|---|
| Ex. 2-1 | oven heating, in atmosphere, 350°C, 1 h | ITO(Sn10wt%) | oxalic acid based | YES |
| Ex. 2-2 | Nd-YAG laser irradiation (4 fold wave $\lambda$ : 266 nm) 500 mJ/cm$^2$ | AlCu (Cu5wt%) | PAN based | YES |
| Ex. 2-3 | excimer laser irradiation ($\lambda$ : 248 nm) 500 mJ/cm$^2$ | Cu | $H_2O_2$ based | YES |
| Ex. 2-4 | oven heating, in atmosphere, 350°C, 1 h | Mo | PAN based | YES |
| Comp. Ex. 2-1 | none | ITO(Sn10wt%) | oxalic acid based | NO |
| Comp. Ex. 2-2 | none | Mo | PAN based | NO |

LIGHT

METHOD FOR MANUFACTURING A FIELD-EFFECT TRANSISTOR

CROSS-REFERENCE TO RELATED APPLICATIONS

The present application is based upon and claims the benefit of priority of Japanese Patent Application No. 2015-244316, filed on Dec. 15, 2015, and Japanese Patent Application No. 2016-224441, filed on Nov. 17, 2016, the contents of which are incorporated herein by reference in their entirety.

BACKGROUND OF THE INVENTION

1. Field of the Invention

The present disclosure relates to a method for manufacturing a field-effect transistor.

2. Description of the Related Art

As an example of field-effect transistors, a field-effect transistor utilizing an active layer of an oxide semiconductor is known. The field-effect transistor utilizing the active layer of the oxide semiconductor has a problem that the active layer is exposed to an etching solution, such as an acidic solution, when patterning of a conducting film is performed to form source and drain electrodes.

Generally, the oxide semiconductor used for the active layer is easily dissolved by an etchant (etching solution) used to form the source and drain electrodes. Conventionally, when patterning of the conducting film is performed to form the source and drain electrodes, an etching stopper layer is provided on the oxide semiconductor for preventing the oxide semiconductor from being damaged by the etchant used to form the source and drain electrodes. For example, see the SID International Symposium, Digest of Technical Papers May 2008, 42-2, page 625, Je-hun Lee et al.

However, in a manufacturing process of a field-effect transistor, as the number of layers of the field-effect transistor increases, the number of steps of photolithographic process increases, and many photomasks used in the steps of photolithographic process are required. Hence, if the etching stopper layer must be utilized, the field-effect transistor manufacturing process becomes complicated. To avoid this, a method for manufacturing a field-effect transistor which does not require the use of the etching stopper layer is demanded.

SUMMARY OF THE INVENTION

In one aspect, the present disclosure provides a method for manufacturing a field-effect transistor in which patterning of a conducting film is performed to form source and drain electrodes without using an etching stopper layer.

In one embodiment, the present disclosure provides a method for manufacturing a field-effect transistor including: forming an active layer of an oxide semiconductor; forming a conducting film to cover the active layer; patterning the conducting film through an etching process using an etchant to form a source electrode and a drain electrode; and performing, at least before the patterning the conducting film, a treatment on the active layer so that an etching rate of the active layer is less than an etching rate of the conducting film.

The object and advantages of the invention will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF THE DRAWINGS

FIG. 3 is a diagram for explaining the manufacturing process of the field-effect transistor according to the first embodiment.

FIG. 4 is a cross-sectional view of a field-effect transistor according to a modification of the first embodiment.

FIG. 5 is a diagram illustrating process conditions and results of Examples 1-1 to 1-16 and Comparative Examples 1-1 and 1-2.

FIG. 6 is a diagram illustrating process conditions of Examples 2-1 to 2-4 and Comparative Examples 2-1 and 2-2.

FIG. 7 is a diagram illustrating process conditions and results of the Examples 2-1 to 2-4 and the Comparative Examples 2-1 and 2-2.

DETAILED DESCRIPTION OF THE PREFERRED EMBODIMENTS

A description will be given of embodiments with reference to the accompanying drawings.

First Embodiment

Figure 1:
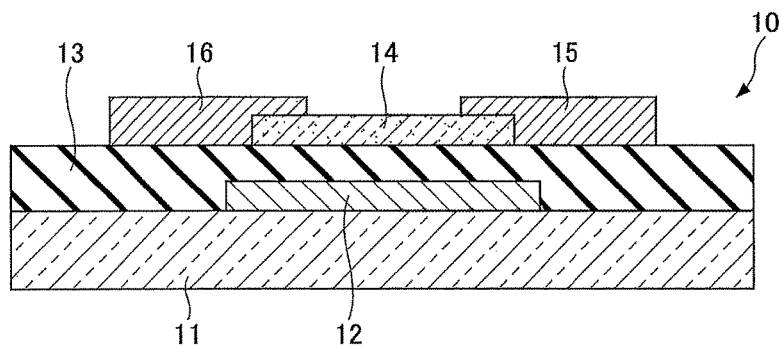
FIG. 1 is a cross-sectional view of a field-effect transistor according to a first embodiment.

FIG. 1 is a cross-sectional view of a field-effect transistor 10 according to a first embodiment. As illustrated in FIG. 1, the field-effect transistor 10 is a top contact/bottom gate field-effect transistor including a substrate 11, a gate electrode 12, a gate insulating layer 13, an active layer 14, a source electrode 15, and a drain electrode 16. This field-effect transistor 10 is a typical example of the field-effect transistor according to the first embodiment.

In the field-effect transistor 10, the gate electrode 12 is formed on the insulating substrate 11, and the gate insulating layer 13 is formed to cover the gate electrode 12. The active layer 14 is formed on the gate insulating layer 13, and the source electrode 15 and the drain electrode 16 are formed on the active layer 14 so that a channel may be formed in the active layer 14. In the following, the components of the field-effect transistor 10 will be described.

Note that, in the first embodiment, the side of the active layer 14 corresponds to the upper side or one side, while the side of the substrate 11 corresponds to the lower side or the other side, for the sake of illustration. Further, a surface of a layer on the side of the active layer 14 corresponds to a top surface or one surface of the layer, and a surface of a layer on the side of the substrate 11 corresponds to a bottom surface or the other surface of the layer. However, the field-effect transistor 10 may be used in an inverted state and may be disposed at an arbitrary angle. A plane view corresponds to a diagram of an object when viewed from a direction normal to the top surface of the substrate 11, and a plane shape corresponds to a shape of an object when viewed from the direction normal to the top surface of the substrate 11. Further, a longitudinal cross section is a cross section taken in a lamination direction of the layers on the substrate 11, and a lateral cross section is a cross section taken in a direction vertical to the lamination direction of the layers on the substrate 11 (or in a direction parallel to the top surface of the substrate 11).

A shape, a structure, and a size of the substrate 11 may be appropriately selected according to the intended application without limitation.

A material of the substrate 11 may be appropriately selected according to the intended application without limitation. For example, a glass substrate, a ceramic substrate, a plastic substrate, or a film substrate may be used. A type of the glass substrate may be appropriately selected according to the intended application without limitation. For example, non-alkali glass or silica glass may be used as the glass substrate. A type of the plastic substrate or the film substrate may be appropriately selected according to the intended application without limitation. For example, polycarbonate (PC), polyimide (PI), polyethyleneterephthalate (PET) or polyethylenenaphthalate (PEN) may be used. Note that, for increased surface cleanliness and improved adhesion, it is preferable to perform pretreatment of oxygen plasma, UV ozone or UV irradiation washing on the substrate 11.

The gate electrode 12 is formed in a predetermined region on the substrate 11. The gate electrode 12 is an electrode for applying gate voltage. A material of the gate electrode 12 may be appropriately selected according to the intended application without limitation. For example, a metal (e.g., Al, Pt, Pd, Au, Ag, Cu, Zn, Ni, Cr, Ta, Mo, and Ti), an alloy of these metals, or a mixture of these metals may be used. Further, a conductive oxide (e.g., indium oxide, zinc oxide, tin oxide, gallium oxide, and niobium oxide), a composite compound of these conductive oxides, or a mixture of these conductive oxides may be used as the material of the gate electrode 12. An average thickness of the gate electrode 12 may be appropriately selected according to the intended application without limitation. However, it is preferable that the average thickness of the gate electrode 12 is in a range between 10 nm and 1 µm, and more preferably it is in a range between 50 nm and 300 nm.

The gate insulating layer 13 is an insulating layer disposed between the gate electrode 12 and the active layer 14 to electrically insulate the gate electrode 12 from the active layer 14. A material of the gate insulating layer 13 is appropriately selected according to the intended application without limitation. For example, an inorganic insulating material or an organic insulating material may be used. Examples of the inorganic insulating material include silicon oxide, aluminum oxide, tantalum oxide, titanium oxide, yttrium oxide, lanthanum oxide, hafnium oxide, zirconium oxide, silicon nitride, aluminum nitride, and a mixture of these oxides. Further, examples of the organic insulating material include polyimide, polyamide, polyacrylate, polyvinylalcohol, and a novolak resin. An average thickness of the gate insulating layer 13 is appropriately selected according to the intended application without limitation. However, it is preferable that the average thickness of the gate insulating layer 13 is in a range between 50 nm and 3 µm, and more preferably in a range between 100 nm and 1 µm.

The active layer 14 is a thin film of an oxide semiconductor formed on the gate insulating layer 13 and provided to face the gate electrode 12 through the gate insulating layer 13. For example, a material of the active layer 14 is an n-type oxide semiconductor.

The n-type oxide semiconductor which forms the active layer 14 is appropriately selected according to the intended application without limitation. However, it is preferable that the n-type oxide semiconductor contains at least any one of indium (In), zinc (Zn), tin (Sn), and titanium (Ti) in addition to an alkaline earth element or a rare earth element. It is more preferable that the n-type oxide semiconductor contains indium (In) in addition to an alkaline earth element, a rare earth element, Al, Zr, or Hf.

Examples of the alkaline earth element include beryllium (Be), magnesium (Mg), calcium (Ca), strontium (Sr), barium (Ba), and radium (Ra). Examples of the rare earth element include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

An electron carrier concentration of an oxide semiconductor varies in a range of $10^{18}$ cm$^{-3}$ to $10^{20}$ cm$^{-3}$ according to the amount of oxygen vacancies. However, an oxide semiconductor may be unstable since there is a possibility that the oxygen vacancies occur unexpectedly during a post process after the deposition of an oxide semiconductor film. For example, in a case of indium oxide, it is preferable to form the oxide semiconductor film containing indium and another metal element selected from alkaline earth elements and rare earth elements, which are more easily coupled with oxygen than indium, in order to suppress the unexpected generation of the oxygen vacancies and facilitate the control of the composition for a desired control of the electron carrier concentration. This also holds true for metal oxides other than indium oxide, constituting the n-type oxide semiconductor.

Further, it is preferable that the n-type oxide semiconductor which forms the active layer 14 undergoes substitutional doping with at least one dopant selected from the group consisting of a divalent cation, a trivalent cation, a tetravalent cation, a pentavalent cation, a hexavalent cation, a heptavalent cation, and an octavalent cation, and wherein a valence of the dopant is more than a valence of a metal ion constituting the n-type oxide semiconductor, provided that the dopant is excluded from the metal ion. Note that the substitutional doping is also referred to as n-type doping.

The source electrode 15 and the drain electrode 16 are formed on the gate insulating layer 13. The source electrode 15 and the drain electrode 16 are formed to cover a part of the active layer 14 and separated from each other at a predetermined distance. The source electrode 15 and the drain electrode 16 are electrodes for extracting electric current in response to the gate voltage applied to the gate electrode 12. Note that wiring lines connected to the source electrode 15 and the drain electrode 16 are formed on the layer where the source electrode 15 and the drain electrode 16 are formed.

A material of a conducting film 150 (see FIG. 3 (b)) which is used to form the source electrode 15 and the drain electrode 16 may be appropriately selected according to the intended application without limitation. For example, any one of Al, Pt, Pd, Au, Ag, Cu, Zn, Ni, Cr, Ta, Mo, Ti, an alloy of these metals, a mixture of these metals, and a conductive oxide may be used as the material of the conductive film 150.

When an etching solution used in a wet etching process for patterning of the conducting film 150 on the active layer 14 is taken into consideration, it is preferable to use any one of Al, Mo, an alloy containing Al or Mo, and a conductive oxide containing indium oxide as the material of the conductive film 150. The alloy containing Al may further contain any of Si, Ti, Cu, Ta, Nd, Zn, and Ni other than Al. The alloy containing Mo may further contain any of Ti, Nb, Ta, Cr, V, and W other than Mo.

For example, any one of indium tin oxide (ITO), indium zinc oxide (IZO), indium tungsten oxide (IWO), and indium gallium oxide (IGO) may be contained in the conductive oxide containing indium oxide. In view of a wet etching process, it is preferable that the conducting film 150 before etching has low crystallinity.

Further, the source electrode 15 and the drain electrode 16 may be formed by a multilayer film of the material of the conducting film 150. In this case, it is preferable that a lowermost layer of the multilayer film is made of any one of Al, Mo, the alloy containing Al or Mo, and the conductive oxide containing indium oxide. An average thickness of each of the source electrode 15 and the drain electrode 16 is appropriately selected according to the intended application without limitation. However, it is preferable that the average thickness of each electrode is in a range between 10 nm and 1 μm, and more preferably in a range between 50 nm and 300 nm.

[Method for Manufacturing Field-Effect Transistor]

Figure 2:
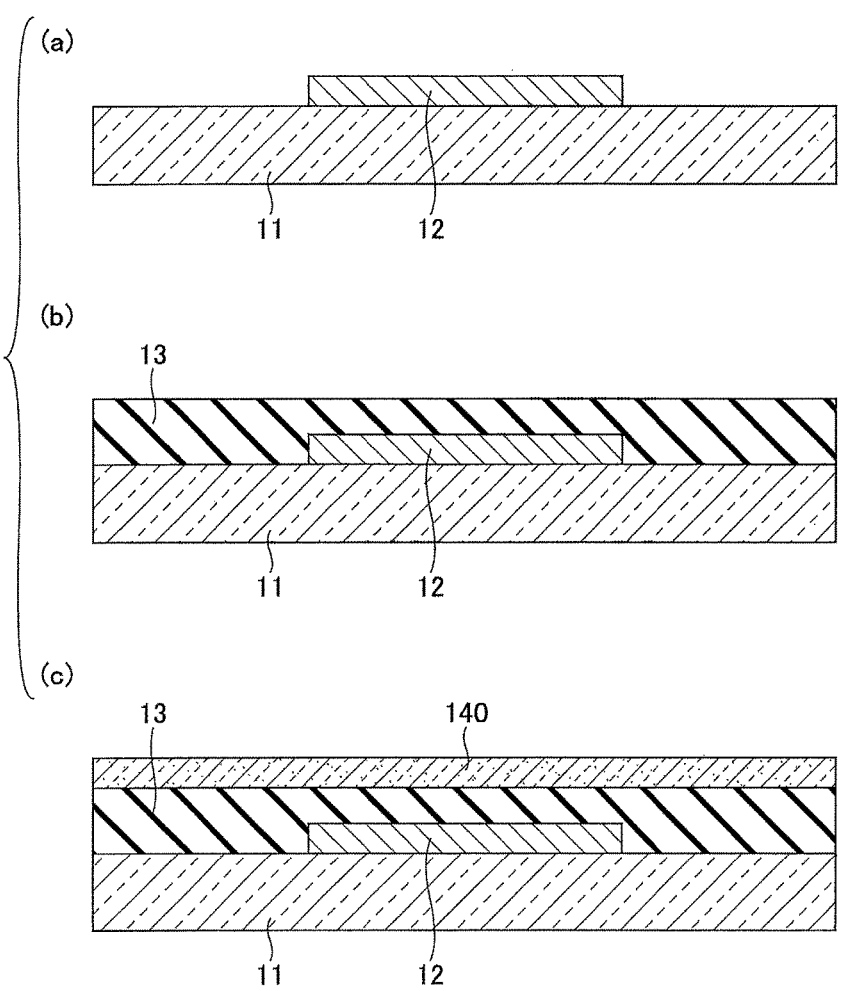
FIG. 2 is a diagram for explaining a manufacturing process of the field-effect transistor according to the first embodiment.

Next, a method for manufacturing the field-effect transistor illustrated in FIG. 1 is explained. FIG. 2 is a diagram for explaining a manufacturing process of the field-effect transistor 10 according to the first embodiment.

In the step illustrated in FIG. 2 (a), a substrate 11 is prepared from a glass substrate. A conducting film of Al (aluminum) is formed on the substrate 11 by a vacuum deposition process, and the conducting film is patterned by a photolithographic and etching process to form a gate electrode 12 having a predetermined shape. For increased surface cleanliness and improved adhesion of the substrate 11, it is preferable to perform a pretreatment of oxygen plasma, UV ozone, or UV irradiation washing on the substrate 11 before forming the gate electrode 12. As described in the foregoing, the materials and the thicknesses of the substrate 11 and the gate electrode 12 may be appropriately selected.

In the step illustrated in FIG. 2 (b), a gate insulating layer 13 is formed to cover the gate electrode 12 on the substrate 11 by a sputtering process. For example, the gate insulating layer 13 may be formed by depositing a film of silicon oxide on the substrate 11. However, the material and the thickness of the gate insulating layer 13 may be appropriately selected as described in the foregoing.

In the step illustrated in FIG. 2 (c), an oxide semiconductor, layer 140 is formed on the overall surface of the gate insulating layer 13. A forming method of the oxide semiconductor layer 140 may be appropriately selected according to the intended application without limitation. Examples of the forming method include a vacuum film forming method (e.g., sputtering, pulsed laser deposition (PLD), chemical vapor deposition (CVD), atomic layer deposition (ALD)) and a solution film forming method (e.g., die coating, spin coating, dip coating using an oxide forming coating liquid). For example, the oxide semiconductor layer 140 may be formed using an n-type oxide semiconductor. A crystalline state and an amorphous state may be mixed in the formed oxide semiconductor layer 140.

When the oxide semiconductor layer 140 is formed using an oxide forming coating liquid in the wet coating process, a removing method of a solvent of the oxide forming coating liquid may be appropriately selected according to the intended application without limitation. However, it is preferable to dry and bake the coated film by heating to remove the solvent. It is preferable that a temperature of the heating is in a range between 30° C. and 300° C., and more preferably in a range between 50° C. and 250° C. A period of the heating may be appropriately selected according to the intended application without limitation.

FIG. 3 is a diagram for explaining the manufacturing process of the field-effect transistor 10 according to the first embodiment.

In the step illustrated in FIG. 3 (a), patterning of the oxide semiconductor layer 140 formed on the overall surface of the gate insulating layer 13 is performed by a photolithographic and wet etching process, so that the active layer 14 is formed to have a predetermined shape. When etching the oxide semiconductor layer 140, an acidic etchant, such as a PAN (a mixed solution of phosphoric acid, acetic acid, and nitric acid) based etchant, may be used. However, in order to increase the level of accuracy of patterning of the active layer 14, it is preferable to use a weak acidic etchant, such as an oxalic acid based etchant. Alternatively, the formation of the active layer 14 may be performed through a metal mask at the time of the formation of the oxide semiconductor layer 140, instead of the photolithographic and wet etching process;

In the step illustrated in FIG. 3 (b), a conducting film 150 of Al (aluminum) which covers the active layer 14 is formed by a vacuum deposition process. Subsequently, in the step illustrated in FIG. 3 (c), patterning of the conducting film 150 is performed by a photolithographic and wet etching process to form the source electrode 15 and the drain electrode 16 having a predetermined shape. The material and the thickness of the source electrode 15 and the drain electrode 16 may be appropriately selected as described above.

An acidic etchant is used when the wet etching of the conducting film 150 is performed. For example, a PAN based etchant is used when wet etching of the conductive film 150 of Al, Mo, or the alloy containing Al or Mo is performed, while an oxalic acid based etchant is used when wet etching of the conductive film 150 of the conductive oxide containing indium oxide is performed. Thereby, it is possible to provide an increased level of accuracy of the patterning of the conducting film 150. A mixing ratio of the mixed solution of phosphoric acid, nitric acid, and acetic acid may be appropriately selected according to the intended application. However, it is preferable that the mixing ratio is set to 40 to 70% of phosphoric acid, 20 to 40% of acetic acid, and 1 to 10% of nitric acid.

Note that, when Al or an alloy of Al is used to form a lowermost layer of the multilayer film as the conducting film 150, if an upper layer of Mo or an alloy of Mo and an upper layer of Ti or an alloy of Ti are deposited in this order on the lowermost layer of Al or the alloy of Al, it is possible to widen the choice of the etching solution in the patterning of the conducting film 150.

When the conducting film 150 is formed in the above-described composition, an organic alkali based etching solution may be used instead of a PAN based etching solution for the etching of the lowermost layer of Al or the alloy of Al. A resist used as a mask in the patterning is dissolved by the organic alkali based etching solution. However, the metal elements which are not dissolved by the organic alkali based etching solution are used to form the upper layers on the lowermost layer, these metal layers act as a mask and then the patterning of the lowermost layer of Al or the alloy of Al may be performed.

As an example of the composition of the multilayer film, a first upper layer of Mo or an alloy of Mo and a second upper layer of Ti or an alloy of Ti may be deposited on the lowermost layer of Al or an alloy of Al. At the time of the patterning, the upper layer patterns are formed earlier by etching of the first upper layer of Mo or the alloy of Mo and the second upper layer of Ti or the alloy of Ti, and such patterns may be used as a mask when etching of the Al layer is performed using the organic alkali based etching solution.

In this case, etching of the second upper layer of Ti or the alloy of Ti may be performed using a fluoric acid based etching solution, and etching of the first upper layer of Mo or the alloy of Mo may be performed using a PAN based etching solution. The mixing ratio of the PAN based etching solution used for the etching of the Mo layer in this case is different from the above-described mixing ratio and may be set to 1 to 10% of phosphoric acid, 30 to 45% of acetic acid, and 20 to 35% of nitric acid. Thereby, it is possible to enhance etch selectivity in etching the upper layers and the lowermost layer of Al.

However, these etching solutions are the same as the etching solution for the oxide semiconductor layer 140.

In order to prevent the active layer 14 from being dissolved by the etching solution used to perform the wet etching of the conducting film 150, in the present embodiment, a treatment (process) is performed on the active layer 14 before performing the wet etching of the conducting film 150. By performing the treatment on the active layer 14, an etching rate of the active layer 14 is less than an etching rate of the conducting film 150. It is preferable that the etching rate of the active layer 14 by the etching solution used to form the source electrode 15 and the drain electrode 16 is 1/10 or less of the etching rate of the conducting film 150 by the etching solution. With the processed active layer 14, it is possible to prevent the damaging of the active layer 14.

An example of the treatment (or process) performed on the active layer 14 for reducing the etching rate of the active layer 14 for the etching solution of the conducting film 150 is a heating process. For example, in this heating process, the active layer 14 is heated at a temperature higher than a temperature at which the film of the oxide semiconductor layer 140 is formed in the step illustrated in FIG. 2 (*c*). By this heating process, the etching rate of the active layer 14 for the acidic etchant, such as a PAN based or oxalic acid based etchant, is reduced. It is preferable that an, amorphous rate of the oxide semiconductor layer 140 after the heating process is performed is reduced to be less than that of the oxide semiconductor layer 140 before the heating process is performed. It is preferable that a temperature of the heating process is in a range between 200° C. and 500° C. However, this temperature must be higher than the temperature at which the film of the oxide semiconductor layer 140 is formed.

The heating process may be performed after an end of the formation of the active layer 14 and before a start of the etching of the conducting film 150. However, when the surface of the conducting film 150 is vulnerable to oxidation by the heating process, there is a possibility that the etching rate of the conducting film 150 is considerably changed or the conducting film 150 is damaged. To avoid this, it is preferable to perform the heating process between the step illustrated in FIG. 3 (*a*) and the step illustrated in FIG. 3 (*b*).

Another example of the treatment (or process) performed on the active layer 14 for reducing etching rate of the active layer 14 for the etching solution of the conducting film 150 is a laser irradiation process. In this laser irradiation process, a laser beam from a light source is emitted to a surface of a substrate, and a thin film on the surface of the substrate is heated momentarily, so that the etching rate of the thin film for the etching solution is reduced.

As the light source used in the laser irradiation process, any one of excimer lasers (KrF (wavelength $\lambda$: 248 nm), XeCl (wavelength $\lambda$: 308 nm)) and Nd-YAG lasers (wavelength $\lambda$: 1064 nm (fundamental wave), 532 nm (2-fold wave), 355 nm (3-fold wave), 266 nm (4-fold wave)) may be appropriately selected according to the absorption wavelength of the active layer 14.

In a case where the laser irradiation process is performed on the active layer 14, the etching solution is applied only to a portion of the conducting film 150 which is above a surface layer of the active layer 14, and the laser irradiation may be applied to only the surface layer of the active layer 14. In this case, the thickness of the surface layer is in a range between 2 nm and 10 nm.

Further, when a metal electrode is formed below the active layer as in a device having a lower electrode layer located below the active layer, a light source configured to emit a laser beam having no absorption wavelength for the active layer and the substrate may be used to apply the laser irradiation. The laser beam is absorbed by the metal electrode located below the active layer, and as a consequence the active layer may be heated by the absorbed laser beam. An example of the device having the lower electrode layer is a top contact/bottom gate field-effect transistor. Similarly, when a metal electrode is formed above the active layer, the laser beam is absorbed by the upper-layer metal electrode, and as a consequence the lower-layer active layer may be heated by the absorbed laser beam.

The etching rate of the active layer 14 for the acidic etching solution such as the PAN based or oxalic acid based etchant, or the etching solution such as the organic alkali based etchant, is reduced by the treatment, and it is possible to prevent the active layer 14 from being damaged by the etching solution for the etching of the conducting film 150 used to form the source electrode 15 and the drain electrode 16. Hence, the wet etching of the conducting film 150 may be performed to form the source electrode 15 and the drain electrode 16 without using a special etching stopper layer.

By performing the manufacturing process described above, it is possible to produce the top contact/bottom gate field-effect transistor 10 according to the first embodiment.

As described above, the inventors have found as a result of repeated experiments that, in a method for manufacturing a field-effect transistor in which an active layer of an oxide semiconductor is formed, if the heating process is performed on the active layer at a temperature higher than a temperature at which a film of the oxide semiconductor is formed, between the step illustrated in FIG. 3 (*a*) and the step illustrated in FIG. 3 (*b*), the active layer remains as the oxide semiconductor film almost without being etched by the acidic etchant, such as a PAN based or oxalic acid based etchant, used in the step illustrated in FIG. 3 (c).

Modification of First Embodiment

In a modification of the first embodiment, a top gate/top contact field-effect transistor is illustrated as an example. Note that, in the modification of the first embodiment, a description of the elements which are the same as corresponding elements in the first embodiment described above is omitted.

FIG. 4 is a cross-sectional view of a field-effect transistor 10A according to the modification of the first embodiment. As illustrated in FIG. 4, the field-effect transistor 10A is a top gate/top contact field-effect transistor. Note that the field-effect transistor 10A is another example of the field-effect transistor according to the present disclosure.

The field-effect transistor 10A has a layer structure different from that of the field-effect transistor 10 (see FIG. 1). Specifically, as illustrated in FIG. 4, the field-effect transistor 10A includes a substrate 11, a source electrode 15 and a drain electrode 16 both formed on the substrate 11, an active layer 14 disposed between the source electrode 15 and the drain electrode 16, a gate insulating layer 13 formed on the active layer 14, the source electrode 15, and the drain electrode 16, and a gate electrode 12 formed on the gate insulating layer 13.

A layer structure of the field-effect transistor according to the modification of the first embodiment may be appropriately selected according to the intended application without limitation. Note that the top gate/top contact field-effect transistor may be manufactured by performing the formation of the gate insulating layer and the formation of the gate electrode after the formation of the active layer and the formation of the source electrode and the drain electrode. The etching solution used to form the source electrode and the drain electrode is the same as that of the first embodiment.

Examples of the field-effect transistor according to the first embodiment will be described in the following. However, the following Examples shall not be construed as limiting the scope of the present disclosure in any way.

Example 1-1

In Example 1-1, a top contact/bottom gate field-effect transistor as illustrated in FIG. 1 was produced.
(Formation of Gate Electrode)
A conductive film made of Al having a thickness of 100 nm was formed on the glass substrate 11 by sputtering. A resist pattern was formed on the Al film by a photolithographic process, and etching of the Al film was performed to form the gate electrode 12 having a predetermined shape.
(Formation of Gate Insulating Layer)
Subsequently, the gate insulating layer 13 made of SiON and having a thickness of 200 nm was formed by sputtering.
(Formation of Active Layer)
An oxide semiconductor film made of Al doped $MgIn_2O_4$ (i.e., a film of In—Mg—Al—O to form the active layer 14) was formed to have a thickness of 50 nm on the gate insulating layer 13 by RF magnetron sputtering. A polycrystalline sintered body represented by the composition of $MgIn_{1.99}Al_{0.01}O_4$ was used as a target. Argon gas and oxygen gas were introduced as sputtering gas. The total pressure was fixed to 1.1 Pa and the oxygen concentration was set to 20 volume %. Note that temperature control of the substrate 11 was not performed. Although the temperature of the substrate 11 rises automatically in the process of sputtering, it was confirmed that the temperature of the substrate 11 was maintained at 40° C. or less. That is, the forming temperature of the film of In—Mg—Al—O was 40° C. or less. The patterning was performed using a metal mask and the active layer 14 was formed.
(Treatment on Active Layer)
The heating process was performed on the active layer 14 using an oven at 350° C. for 1 hour in the atmosphere.
(Formation of Source and Drain Electrodes)
Al was deposited by sputtering on the active layer 14 as the conducting film 150 and the film thickness was 100 nm. Subsequently, a resist pattern was formed on the Al film by a photolithographic process. Etching of the Al film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 1-2

In Example 1-2, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
Al and Mo were continuously deposited by sputtering on the active layer 14 as the multilayer conducting film 150, and the film thickness of Al was 100 nm and the film thickness of Mo was 30 nm. Subsequently, a resist pattern was formed on the multilayer film of Al and Mo by a photolithographic process. Etching was performed using a PAN based etching solution, and the source electrode 15 and the drain electrode 16 having a predetermined shape were formed on the active layer 14. Hence, the top contact/bottom gate field-effect transistor as illustrated in FIG. 1 was produced.

Example 1-3

In Example 1-3, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
Mo and Ti were continuously deposited by sputtering on the active layer 14 as the multilayer conducting film 150, and the film thickness of Mo was 100 nm and the film thickness of Ti was 30 nm. Subsequently, a resist pattern was formed on the multilayer film of Mo and Ti by a photolithographic process. Etching of the Mo film was performed by using a PAN based etching solution, and etching of the Ti film was performed using a hydrofluoric acid based etching solution, so that the source electrode 15 and the drain electrode 16 having a predetermined shape were formed on the active layer 14. Hence, the top contact/bottom gate field-effect transistor as illustrated in FIG. 1 was produced.

Example 1-4

In Example 1-4, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
A film of ITO in which Sn is doped by 10 weight % into indium oxide (i.e., an In-based transparent conducting film) and a film of Mo were continuously deposited by sputtering on the active layer 14 as the multilayer conducting film 150, and the film thickness of ITO was 100 nm and the film thickness of Mo was 30 nm. Subsequently, a resist pattern was formed on the multilayer film of ITO and Mo by a photolithographic process. Etching of the ITO film was performed using an oxalic acid based etching solution, and etching of the Mo film was performed using a PAN based etching solution, so that the source electrode 15 and the drain electrode 16 having a predetermined shape were formed on the active layer 14.

Example 1-5

In Example 1-5, the field-effect transistor as illustrated in FIG. 1 was produced in the same manner as in the Example 1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
A film of an AlSi alloy in which Si is included by 0.5 weight % was deposited by sputtering on the active layer 14 as the conducting film 150 and the film thickness was 100 nm. Subsequently, a resist pattern was formed on the AlSi alloy film by a photolithographic process. Etching of the AlSi alloy film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 1-6

In Example 1-6, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
A film of a MoW alloy in which W is included by 1 weight % and a film of Ti were continuously deposited by sputtering on the active layer 14 as the multilayer conducting film 150, and the film thickness of MoW was 100 nm and the film thickness of Ti was 30 nm. Subsequently, a resist pattern was formed on the multilayer film of MoW and Ti by a photolithographic process. Etching of the Ti film was performed using a hydrofluoric acid based etching solution and etching of the MoW film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 1-7

In Example 1-7, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
A film of MoW in which W is included by 1 weight % was deposited by sputtering on the active layer 14 as the conducting film 150 and the film thickness of MoW was 100 nm. A resist pattern was formed on the MoW film by a photolithographic process, and etching of the MoW film was performed using a PAN based etching solution, so that the source electrode 15 and the drain electrode 16 having a predetermined shape were formed on the active layer 14.

Example 1-8

In Example 1-8, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
The heating process was performed on the active layer 14 using an oven as illustrated in FIG. 5.
(Formation of Source and Drain Electrodes)
A film of ITO in which Sn is doped by 10 weight % in indium oxide was deposited by sputtering on the active layer 14 as the conducting film 150, and the film thickness of ITO was 100 nm. A resist pattern was formed on the ITO film by a photolithographic process, and etching of the ITO film was performed using an oxalic acid based etching solution, so that the source electrode 15 and the drain electrode 16 having a predetermined shape were formed on the active layer 14.

Example 1-9

In Example 1-9, the field-effect transistor as illustrated in FIG. 1 was produced in the same manner as in the Example 1-1, provided that the following process conditions were changed.

(Formation of Active Layer)

The active layer 14 was formed by changing the target as illustrated in FIG. 5.

(Treatment on Active Layer)

The heating process was performed on the active layer 14 using an oven as illustrated in FIG. 5.

(Formation of Source and Drain Electrodes)

Al, Mo and Ti were sequentially deposited by sputtering in this order on the active layer 14 as the multilayer conducting film 150, and the film thickness of Al was 100 nm, the film thickness of Mo was 30 nm, and the film thickness of Ti was 30 nm. Subsequently, a resist pattern was formed on the multilayer film of Al, Mo and Ti by a photolithographic process. Etching of the Ti film was performed using a hydrofluoric acid based etching solution, and etching of the Mo film was performed by using a PAN based etching solution, so that an upper layer pattern was formed on the lowermost layer of the Al film. The upper layer pattern is used as a mask, and etching of the Al film was performed using an organic alkali based etching solution, so that the source electrode 15 and the drain electrode 16 having a predetermined shape were formed on the active layer 14. Hence, the top contact/bottom gate field-effect transistor as illustrated in FIG. 1 was produced.

Example 1-10

In Example 1-10, the field-effect transistor as illustrated in FIG. 1 was produced in the same manner as in the Example 1-1, provided that the following process conditions were changed.

(Formation of Active Layer)

The active layer 14 was formed by changing the target as illustrated in FIG. 5.

(Treatment on Active Layer)

The heating process was performed on the active layer 14 using an oven as illustrated in FIG. 5.

(Formation of Source and Drain Electrodes)

Ti was deposited by sputtering on the active layer 14 as the conducting film 150 and the film thickness of Ti was 100 nm. Subsequently, a resist pattern was formed on the Ti film by a photolithographic process. Etching of the Ti film was performed using a hydrofluoric acid based etching solution, and the source electrode 15 and the drain electrode 16 having a predetermined shape were formed on the active layer 14. Hence, the top contact/bottom gate field-effect transistor as illustrated in FIG. 1 was produced.

Example 1-11

In Example 1-11, the field-effect transistor as illustrated in FIG. 1 was produced in the same manner as in the Example 1-1, provided that the following process conditions were changed.

(Formation of Active Layer)

The active layer 14 was formed by changing the target as illustrated in FIG. 5.

(Treatment on Active Layer)

The heating process was performed on the active layer 14 using an oven as illustrated in FIG. 5.

(Formation of Source and Drain Electrodes)

A film of ITO in which Sn is doped by 10 weight % in indium oxide was deposited by sputtering on the active layer 14 as the conducting film 150 and the film thickness of ITO was 100 nm. A resist pattern was formed on the ITO film by a photolithographic process, and etching of the ITO film was performed using an oxalic acid based etching solution, so that the source electrode 15 and the drain electrode 16 having a predetermined shape were formed on the active layer 14.

Example 1-12

In Example 1-12, the field-effect transistor as illustrated in FIG. 1 was produced in the same manner as in the Example 1-1, provided that the following process conditions were changed.

(Formation of Active Layer)

The active layer 14 was formed by changing the target as illustrated in FIG. 5.

(Treatment on Active Layer)

The heating process was performed on the active layer 14 using an oven as illustrated in FIG. 5.

(Formation of Source and Drain Electrodes)

Mo and Al were continuously deposited by sputtering on the active layer 14 as the multilayer conducting film 150, and the film thickness of Mo was 60 nm and the film thickness of Al was 60 nm. Subsequently, a resist pattern was formed on the multilayer film of Mo and Al by a photolithographic process. Etching of the film was performed using an oxalic acid based etching solution, and etching of the Mo film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 1-13

In Example 1-13, the field-effect transistor as illustrated in FIG. 1 was produced in the same manner as in the Example 1-1, provided that the following process conditions were changed.

(Formation of Active Layer)

The active layer 14 was formed by changing the target as illustrated in FIG. 5.

(Treatment on Active Layer)

Instead of the heating process, the laser irradiation process was performed on the active layer 14 using an excimer laser (KrF, wavelength λ of 248 nm) in which the energy density on the substrate surface was set to 500 mJ/cm$^2$ as illustrated in FIG. 5.

(Formation of Source and Drain Electrodes)

Al, Mo and Ti were sequentially deposited by sputtering in this order on the active layer 14 as the multilayer conducting film 150, and the film thickness of Al was 100 nm, the film thickness of Mo was 30 nm and the film thickness of Ti was 30 nm. Subsequently, a resist pattern was formed on the multilayer film of Al, Mo and Ti by a photolithographic process. Etching of the Ti film was performed using a hydrofluoric acid based etching solution, and etching of the Mo film was performed by using a PAN based etching solution, so that an upper layer pattern was formed on the lowermost layer of the Al film. The upper layer pattern is used as a mask, and etching of the Al film was performed using an organic alkali based etching solution, so that the source electrode 15 and the drain electrode 16 having a predetermined shape were formed on the active layer 14. Hence, the top contact/bottom gate field-effect transistor as illustrated in FIG. 1 was produced.

Example 1-14

In Example 1-14, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
Instead of the heating process, the laser irradiation process was performed on the active layer 14 using an excimer laser (KrF, wavelength λ of 248 nm) in which the energy density on the substrate surface was set to 500 mJ/cm$^2$ as illustrated in FIG. 5.
(Formation of Source and Drain Electrodes)
Al was deposited by sputtering on the active layer 12 as the conducting film 150 and the film thickness of Al was 100 nm. Subsequently, a resist pattern was formed on the Al film by a photolithographic process. Etching of the Al film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 1-15

In Example 1-15, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
Instead of the heating process, the laser irradiation process was performed on the active layer 14 using an Nd-YAG laser (4-fold wave, wavelength λ of 266 nm) in which the energy density on the substrate surface was set to 500 mJ/cm$^2$ as illustrated in FIG. 5.
(Formation of Source and Drain Electrodes)
Mo was deposited by sputtering on the active layer 12 as the conducting film 150 and the film thickness of Mo was 100 nm. Subsequently, a resist pattern was formed on the Mo film by a photolithographic process. Etching of the Mo film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 1-16

In Example 1-16, the field-effect transistor as illustrated in FIG. 1 was produced in the same manner as in the Example 1-1, provided that the following process conditions were changed.
(Formation of Active Layer)
The active layer 14 was formed by changing the target as illustrated in FIG. 5.
(Treatment on Active Layer)
Instead of the heating process, the laser irradiation process was performed on the active layer 14 using an Nd-YAG laser (4-fold wave, wavelength λ of 266 nm) in which the energy density on the substrate surface was set to 500 mJ/cm$^2$ as illustrated in FIG. 5.
(Formation of Source and Drain Electrodes)
Al, Mo and Ti were sequentially deposited by sputtering in this order on the active layer 14 as the multilayer conducting film 150, and the film thickness of Al was 100 nm, the film thickness of Mo was 30 nm and the film thickness of Ti was 30 nm. Subsequently, a resist pattern was formed on the multilayer film of Al, Mo and Ti by a photolithographic process. Etching of the Ti film was performed using a hydrofluoric acid based etching solution, and etching of the Mo film was performed by using a PAN based etching solution, so that an upper layer pattern was formed on the lowermost layer of the Al film. The upper layer pattern is used as a mask, and etching of the Al film was performed using an organic alkali based etching solution, so that the source electrode 15 and the drain electrode 16 having a predetermined shape were formed on the active layer 14. Hence, the top contact/bottom gate field-effect transistor as illustrated in FIG. 1 was produced.

Comparative Example 1-1

In Comparative Example 1-1, the field-effect transistors as illustrated in FIG. 1 was produced in the same manner as in the Example 1-1, provided that the heating or laser irradiation process for reducing the etching rate of the active layer for the etching solution used in the formation of the source and drain electrodes was not performed after the active layer pattern was formed as illustrated in FIG. 5.

Comparative Example 1-2

In Comparative Example 1-2, the field-effect transistors as illustrated in FIG. 1 was produced in the same manner as in the Example 1-7, provided that the heating or laser irradiation process for reducing the etching rate of the active layer for the etching solution used in the formation of the source and drain electrodes was not performed after the active layer pattern was formed as illustrated in FIG. 5.

Example 2-1

In Example 2-1, the field-effect transistor as illustrated in FIG. 1 was produced in the same manner as in the Example 1-1, provided that the following process conditions were changed.
(Preparation of Oxide Forming Coating Liquid)
A yttrium 2-ethylhexanoate solution (Y: 8 weight %) as a material A, an indium 2-ethylhexanoate toluene solution (In: 5 weight %) as a material B, and a titanium n-butoxide solution as a material C were prepared. These solutions were weighed such that 5 mmol of yttrium, 99.8 mmol of indium, and 0.2 mmol of titanium were obtained; 800 mL of mesitylene as a solvent D was added to a beaker, and the solutions were dissolved by mixing the same at a room temperature, so that an oxide forming coating liquid 2-1 was prepared.
(Formation of Active Layer)
The oxide forming coating liquid 2-1 was applied to the gate insulating layer 13 by using a spin coater. The oxide forming coating liquid 2-1 was dried in an oven at 120° C. for 1 hour in the atmosphere, and subsequently baked at 200° C. for 1 hour in the atmosphere so that the oxide semiconductor layer 140 was obtained. Subsequently, a resist pattern was formed on the oxide semiconductor layer 140 by a photolithographic process. Etching was performed using an oxalic acid based etchant, and the active layer 14 was formed on the gate insulating layer 13. The film thickness of the active layer 14 was 30 nm.

(Treatment on Active Layer)

The heating process was performed on the active layer 14 using an oven at 350° C. for 1 hour in the atmosphere as illustrated in FIG. 7.

(Formation of Source and Drain Electrodes)

A film of ITO in which Sn is doped by 10 weight % into indium oxide (i.e., an In-based transparent conducting film) was deposited by sputtering on the active layer 14 as the conducting film 150 and the film thickness was 100 nm. Subsequently, a resist pattern was formed on the ITO film by a photolithographic process. Etching of the ITO film was performed using an oxalic acid based etching solution, so that the source electrode 15 and the drain electrode 16 having a predetermined shape were formed on the active layer 14.

Example 2-2

In Example 2-2, the field-effect transistor as illustrated in FIG. 1 was produced in the same manner as in the Example 2-1, provided that the following process conditions were changed.

(Preparation of Oxide Forming Coating Liquid)

An oxide forming coating liquid 2-2 was prepared in the same manner as in the Example 2-1 by using the composition of Materials A, B, and C and Solvents D and E illustrated in FIG. 6.

(Formation of Active Layer)

Using the oxide forming coating liquid 2-2, the active layer 14 was formed in the same manner as in the Example 2-1.

(Treatment on Active Layer)

Instead of the heating process, the laser irradiation process was performed on the active layer 14 using an Nd-YAG laser (4-fold wave, wavelength A of 266 nm) in which the energy density on the substrate surface was set to 500 mJ/cm as illustrated in FIG. 7.

(Formation of Source and Drain Electrodes)

A film of an AlCu alloy in which Cu is included by 5 weight % was deposited by sputtering on the active layer 14 as the conducting film 150 and the film thickness was 100 nm. Subsequently, a resist pattern was formed on the AlCu alloy film by a photolithographic process. Etching of the AlCu alloy film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Example 2-3

In Example 2-3, the field-effect transistor as illustrated in FIG. 1 was produced in the same manner as in the Example provided that the following process conditions were changed.

(Preparation of Oxide Forming Coating Liquid)

An oxide forming coating liquid 2-3 was prepared in the same manner as in the Example 2-1 by using the composition of Materials A, B, and C and Solvents D and E illustrated in FIG. 6.

(Formation of Active Layer)

Using the oxide forming coating liquid 2-3, the active layer 14 was formed in the same manner as in the Example 2-1.

(Treatment on Active Layer)

Instead of the heating process, the laser irradiation process was performed on the active layer 14 using an excimer laser (KrF, wavelength λ of 248 nm) in which the energy density on the substrate surface was set to 500 mJ/cm$^2$ as illustrated in FIG. 7.

(Formation of Source and Drain Electrodes)

Cu was deposited by sputtering on the active layer 14 as the conducting film 150 and the film thickness was 100 nm. Subsequently, a resist pattern was formed on the Cu film by a photolithographic process. Etching of the Cu film was performed using a $H_2O_2$ based etching solution, so that the source electrode 15 and the drain electrode 16 having a predetermined shape were formed on the active layer 14. Hence, the top contact/bottom gate field-effect transistor as illustrated in FIG. 1 was produced.

Example 2-4

In Example 2-4, the field-effect transistor as illustrated in FIG. 1 was produced in the same manner as in the Example 2-1, provided that the following process conditions were changed.

(Preparation of Oxide Forming Coating Liquid)

An oxide forming coating liquid 2-4 was prepared in the same manner as in the Example 2-1 by using the composition of Materials A, B, and C and Solvents D and E illustrated in FIG. 6.

(Formation of Active Layer)

Using the oxide forming coating liquid 2-4, the active layer 14 was formed in the same manner as in the Example 2-1.

(Treatment on Active Layer)

The heating process was performed on the active layer 14 using an oven at 350° C. for 1 hour in the atmosphere as illustrated in FIG. 7.

(Formation of Source and Drain Electrodes)

Mo was deposited by sputtering on the active layer 14 as the conducting film 150 and the film thickness was 100 nm. Subsequently, a resist pattern was formed on the Mo film by a photolithographic process. Etching of the Mo film was performed using a PAN based etching solution, so that the source electrode 15 and the drain electrode 16 having a predetermined shape were formed on the active layer 14. Hence, the top contact/bottom gate field-effect transistor as illustrated in FIG. 1 was produced.

Comparative Example 2-1

In Comparative Example 2-1, the field-effect transistor as illustrated in FIG. 1 was produced in the same manner as in the Example 2-1, provided that the heating or laser irradiation process for reducing the etching rate of the active layer for the etching solution used in the formation of the source and drain electrodes was not performed after the active layer pattern was formed as illustrated in FIG. 7.

Comparative Example 2-2

In Comparative Example 2-2, the field-effect transistor as illustrated in FIG. 1 was produced in the same manner as in the Example 2-3, provided that the heating or laser irradiation process for reducing the etching rate of the active layer for the etching solution used in the formation of the source and drain electrodes was not performed after the active layer pattern was formed as illustrated in FIG. 7.

Summary of Examples and Comparative Examples

The process conditions and results of the Examples 1-1 to 1-16 and the Comparative Examples 1-1 to 1-2 are illustrated in FIG. 5. In FIG. 5, the presence or absence of the active layer pattern after the process of forming the source and drain electrodes 15 and 16 is represented by YES or NO.

Note that the presence of the active layer pattern was checked by measuring a thickness of the active layer 14 by an atomic force microscope. In the measurement using the atomic force microscope, a step (level difference) between the active layer 14 and the gate insulating layer 13 was regarded as a thickness of the active layer pattern. When the gate insulating layer 13 was etched in the process of forming the source and drain electrodes 15 and 16 and the measurement of a step between the active layer 14 and the gate insulating layer 13 was difficult, a thickness of the active layer 14 was optically determined by a reflectance spectroscopic process. A case where a reduction of a thickness of the active layer pattern after an end of the process of forming the source and drain electrodes 15 and 16 from a thickness of the active layer pattern before a start of the process of forming the source and drain electrodes 15 and 16 was less than 5 nm was designated by YES, and a case where the reduction was 5 nm or greater was designated by NO.

As illustrated in FIG. 5, in all the Examples 1-1 to 1-16, the active layer pattern remained without being dissolved by the etching solution of the conducting film 150 in the process of forming the source and drain electrodes 15 and 16.

Further, in the Examples 1-1 to 1-16, even when the PAN based etchant or the oxalic acid based etchant was used to etch the conducting film 150 for forming the source electrode 15 and the drain electrode 16, the active layer 14 was hardly etched or not etched at all.

On the other hand, it was confirmed in the Comparative Examples 1-1 and 1-2 that the pattern of the active layer 14 was completely dissolved by the acidic etchant of the conducting film 150 in the process of forming the source electrode 15 and the drain electrode 16 and did not remain.

Further, the process conditions and results of the Examples 2-1 to 2-4 and the Comparative Examples 2-1 to 2-2 in which the film deposition of the oxide semiconductor layer 140 was performed by wet process instead of sputtering as a vacuum process are summarized in FIG. 6 and FIG. 7 and the active layer 14 was formed by a wet etching process. Similar to FIG. 5, in FIG. 7, the presence or absence of an active layer pattern after the process of forming the source and drain electrodes 15 and 16 is designated by YES or NO. As illustrated in FIG. 7, it was confirmed that, in all the Examples 2-1 to 2-4, the active layer pattern remained without being dissolved by the etching solution of the conducting film 150 in the process of forming the source and drain electrodes 15 and 16.

Further, in the Examples 2-1 to 2-4, even when the PAN based etchant or the oxalic acid based etchant was used for etching of the conducting film 150 to form the source and drain electrodes 15 and 16, the active layer 14 was hardly etched or not etched at all.

On the other hand, it was confirmed in the Comparative Examples 2-1 and 2-2 that the active layer pattern was completely dissolved by the etching solution of the conducting film 150 in the process of forming the source and drain electrodes 15 and 16 and did not remain.

Accordingly, it was confirmed that performing the heating or laser irradiation process on the active layer 14 under appropriate conditions is helpful for the active layer 14 to have a reduced etching rate for the acidic etching solution such as the PAN based etchant, or the organic alkali based etching solution.

It was confirmed that, by using the method for manufacturing the field-effect transistor according to any one of the above Examples, it is possible to perform patterning of the source electrode and the drain electrode without using an etching stopper layer and it is possible to prevent the active layer 14 from being damaged in the process of the patterning (or the active layer 14 is hardly etched). As a result, it is possible for the thus produced field-effect transistor to provide good electrical characteristics and increased operating stability. Note that such good electrical characteristics include, for example, lowered OFF-state current, increased ON-state current, and lowered subthreshold slope (SS) (SS indicating the voltage required to increase the current 10 times).

Second Embodiment

In a second embodiment, a display element, a display device, and a system in which the field-effect transistor according to the first embodiment is utilized are explained. In the second embodiment, a description of the components which are the same as corresponding components in the first embodiment described above is omitted.

<Display Element>

A display element according to the second embodiment includes at least an optical control element and a drive circuit configured to drive the optical control element, and may further include other components according to the intended application. The optical control element is appropriately selected according to the intended application without limitation, provided that it is an element configured to control optical output according to a driving signal. Examples of the optical control element include an electroluminescence (EL) element, an electrochromic (EC) element, a liquid crystal element, an electrophoretic element, and an electrowetting element.

The driving circuit is appropriately selected according to the intended application without limitation, provided that it includes the field-effect transistor according to the first embodiment. Other components are appropriately selected according to the intended application without limitation.

The display element according to the second embodiment includes the field-effect transistor according to the first embodiment, and it is possible for the display element to provide good electrical characteristics and increased operating stability. As a result, it is possible for the display element to provide displaying with good quality.

<Display Device>

A display device according to the second embodiment includes at least a plurality of display elements according to the second embodiment, a plurality of wiring lines, and a display control device, and may further include other components according to the intended application.

The plurality of display elements are appropriately selected according to the intended application without limitation, provided that they are the display elements according to the second embodiment arrayed in a matrix formation.

The plurality of wiring lines are appropriately selected according to the intended application without limitation, provided that they individually apply a gate voltage and an image data signal to each field-effect transistor in the display elements.

The display control device is appropriately selected according to the intended application without limitation, provided that the display control device individually controls the gate voltage to each field-effect transistor and the signal voltage according to the image data through the wiring lines. Other components are appropriately selected according to the intended application without limitation.

The display device according to the second embodiment includes the display element including the field-effect transistor according to the first embodiment, and it is possible for the display device to provide displaying with good quality.

<System>

A system according to the second embodiment includes at least the display device according to the second embodiment and an image data generating device. The image data generating device is configured to generate image data based on image information to be displayed, and configured to output the image data to the display device.

The system includes the display device according to the second embodiment, and it is possible for the system to display the image information with good quality.

Next, the display element, the display device, and the system according to the second embodiment will be described in detail.

Figure 8:
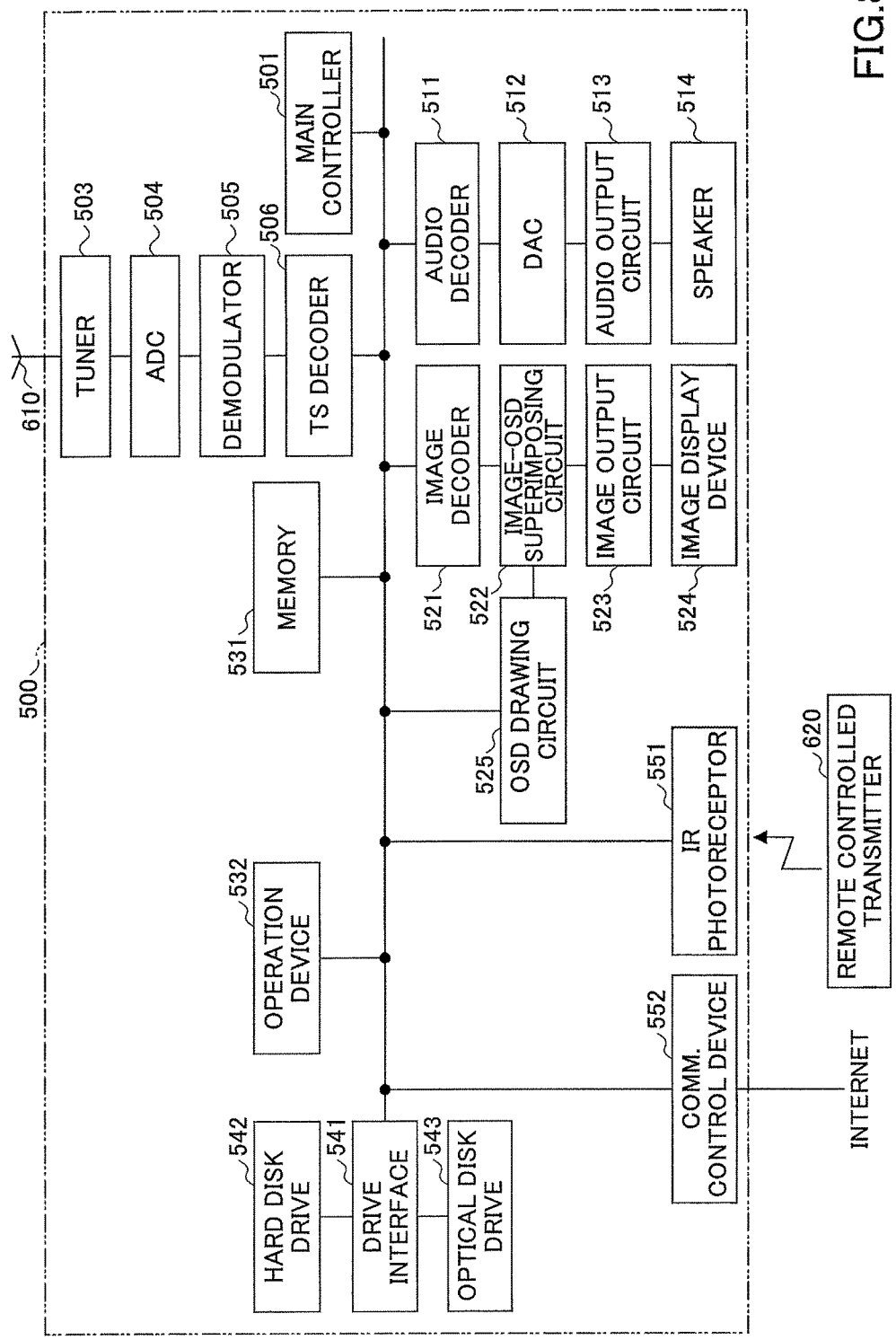
FIG. 8 is a block diagram illustrating a configuration of a television apparatus according to a second embodiment.

FIG. 8 illustrates a configuration of a television apparatus 500 which is an example of the system according to the second embodiment. Note that connecting lines in FIG. 8 indicate typical flows of signals or information only and they do not indicate all connections between the components of the television apparatus 500.

As illustrated in FIG. 8, the television apparatus 500 includes a main controller 501, a tuner 503, an analog-to-digital converter (ADC) 504, a demodulator 505, a transport stream (TS) decoder 506, an audio decoder 511, a digital-to-analog converter (DAC) 512, an audio output circuit 513, a speaker 514, an image decoder 521, an image/OSD (on-screen display) superimposing circuit 522, an image output circuit 523, an image display device 524, an OSD drawing circuit 525, a memory 531, an operation device 532, a drive interface 541, a hard disk drive 542, an optical disk drive 543, an infrared (IR) photoreceptor 551, and a communication control device 552.

The main controller 501 includes a central processing unit (CPU), a flash read-only memory (ROM), and a random access memory (RAM), and is configured to control overall operations of the television apparatus 500. The flash ROM is configured to store a program written in instruction codes executable by the CPU, and various data used for processing by the CPU. The RAM is configured to provide a work memory for the CPU.

The tuner 503 is configured to select a broadcast of a preset channel from broadcast waves received by an antenna 610. The ADC 504 is configured to convert an output signal (analog information) of the tuner 503 into digital information. The demodulator 505 is configured to demodulate the digital information from the ADC 504.

The TS decoder 506 is configured to TS decode an output signal of the demodulator 505 to separate the output signal into audio information and image information. The audio decoder 511 is configured to decode the audio information from the TS decoder 506. The DAC 512 is configured to convert an output signal of the audio decoder 511 into an analog signal.

The audio output circuit 513 is configured to output an output signal of the DAC 512 to the speaker 514. The image decoder 521 is configured to decode, the image information from the TS decoder 506. The image/OSD superimposing circuit 522 is configured to superimpose an output signal of the image decoder 521 and an output signal of the OSD drawing circuit 525.

The image output circuit 523 is configured to output an output signal of the image/OSD superimposing circuit 522 to the image display device 524. The OSD drawing circuit 525 includes a character generator configured to display characters and graphics on a screen of the image display device 524, and is configured to generate a signal indicating display information based on instructions from the operation device 532 or the IR photoreceptor 551.

The memory 531 is configured to temporarily store audio-visual (AV) data. The operation device 532 includes an input medium (not illustrated), such as a control panel, and is configured to report various information items input from a user to the main controller 501. The drive interface 541 is an interactive communication interface. As an example, the drive interface is configured to conform to the ATA packet interface (ATAPI).

The hard disk drive 542 includes a hard disk and a drive unit configured to drive the hard disk. The drive unit is configured to record data on the hard disk and reproduce the data recorded on the hard disk. The optical disk drive 543 is configured to record data on an optical disk (e.g., a DVD) and reproduce the data recorded on the optical disk.

The IR photoreceptor 551 is configured to receive an optical signal from a remote controlled transmitter 620 and send a notification of the optical signal to the main controller 501. The communication control device 552 is configured to control communication with the Internet. Various types of information may be obtained via the Internet.

Figure 9:
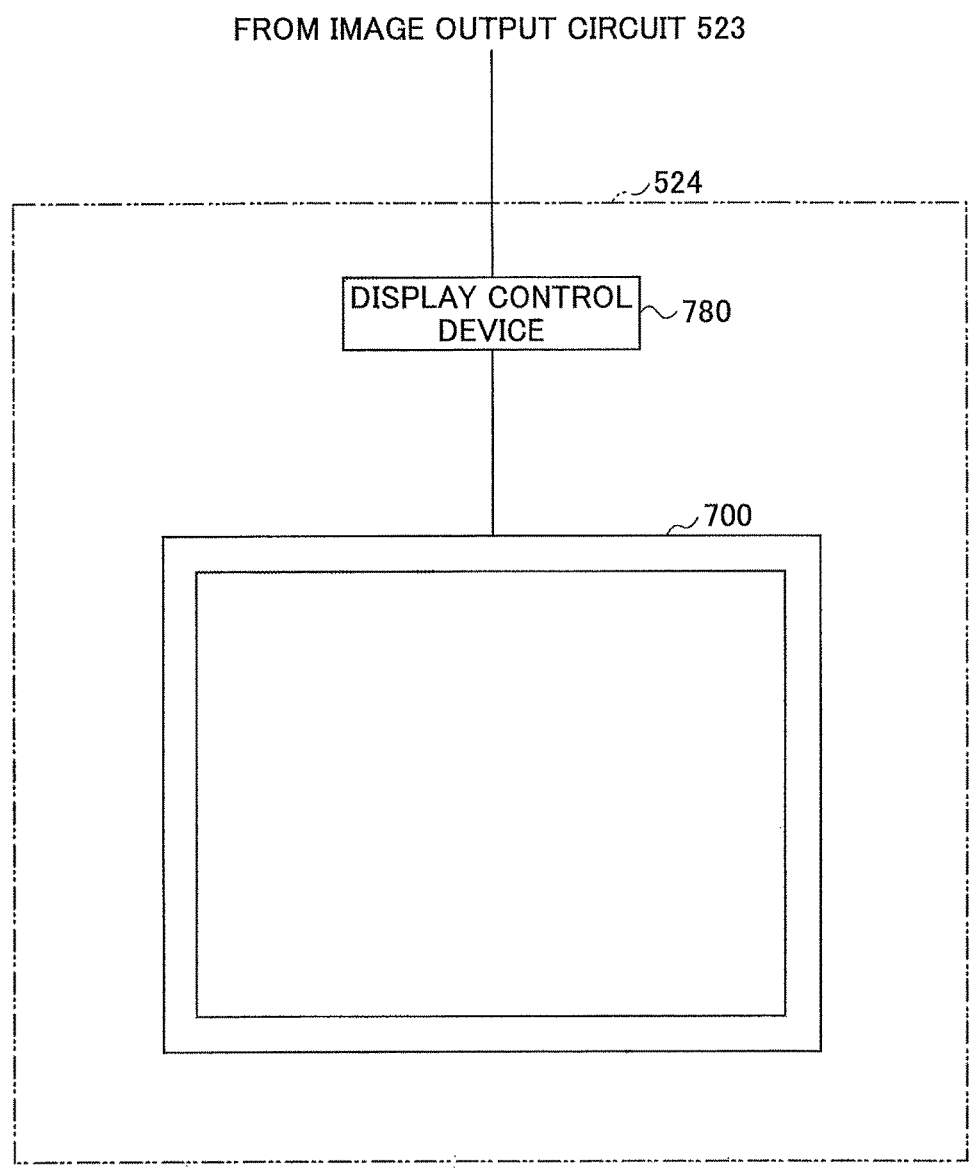
FIG. 9 is a diagram illustrating an image display device of the television apparatus according to the second embodiment.

FIG. 9 illustrates a configuration of an example of the image display device 524 of the television apparatus 500 in FIG. 8. As illustrated in FIG. 9, the image display device 524 includes a display unit 700 and a display control device 780, which will be described below.

Figure 10:
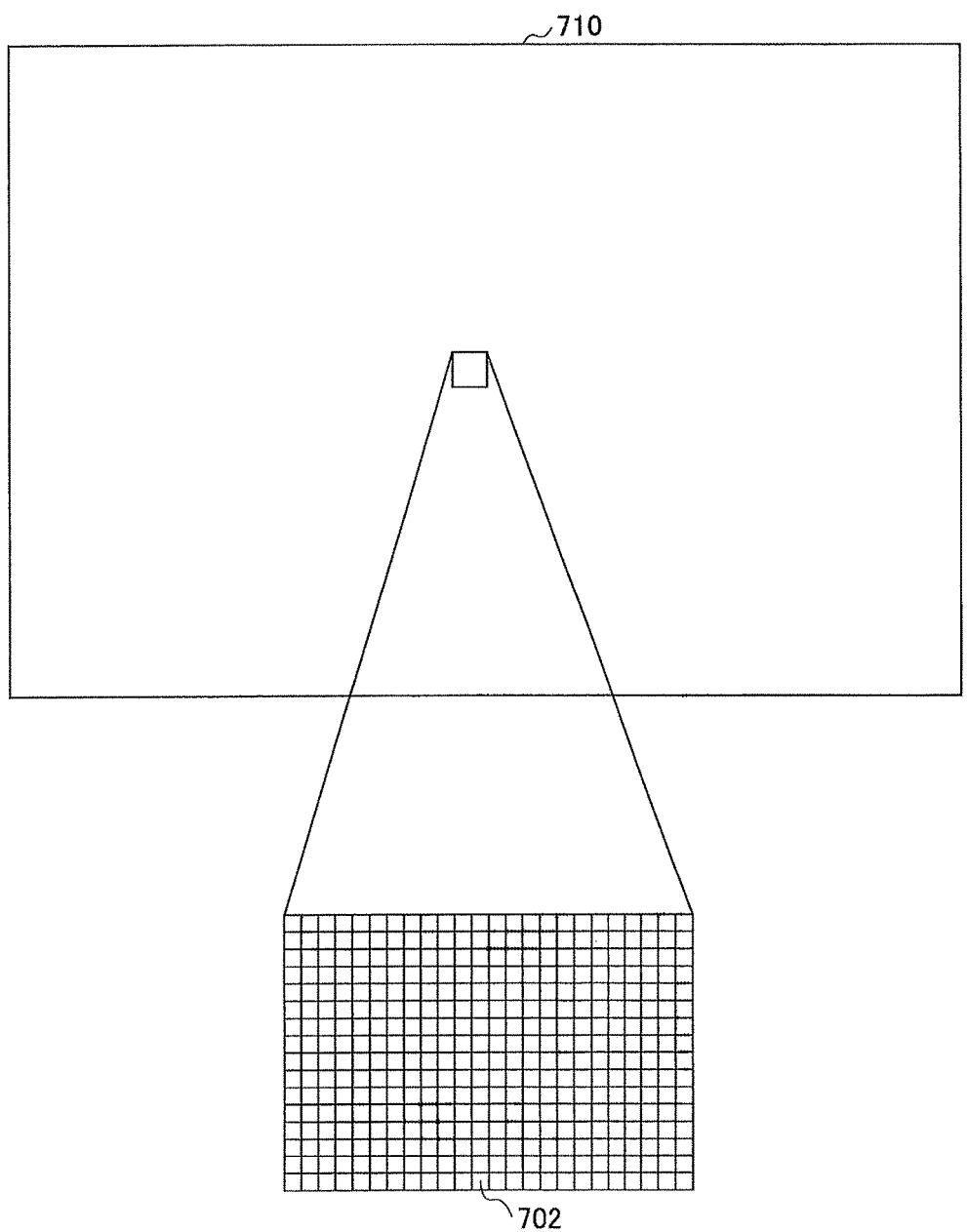
FIG. 10 is a diagram illustrating a display of a display unit of the image display device.

FIG. 10 illustrates a configuration of the display unit 700 in FIG. 9. As illustrated in FIG. 10, the display unit 700 includes a display 710 in which a plurality of display elements 702 (in this example, n×m display elements 702) are arrayed in a matrix formation.

Figure 11:
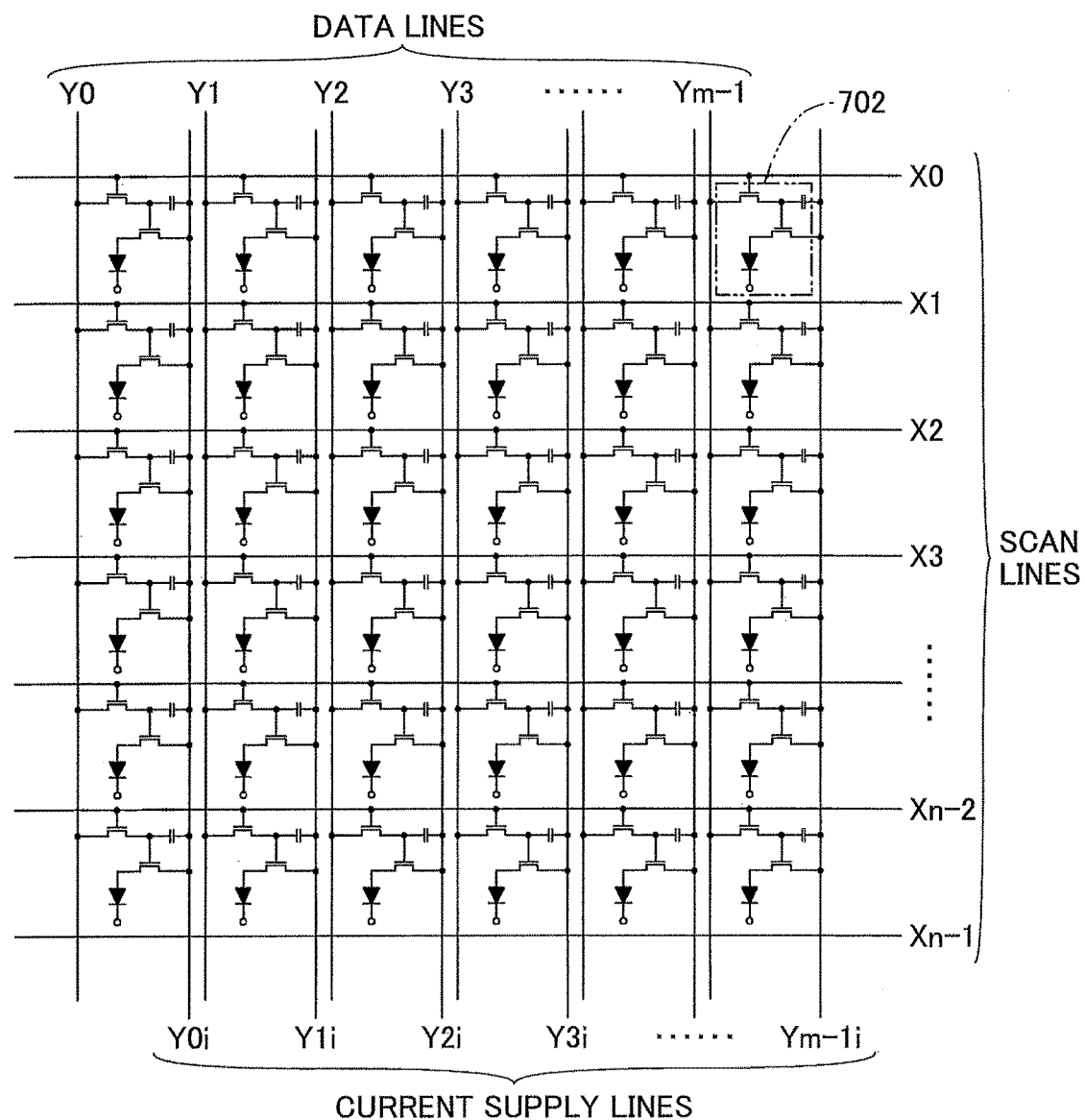
FIG. 11 is a diagram illustrating an example of the display of the display unit.

Further, FIG. 11 illustrates an example of the display 710 of the display unit 700. As illustrated in FIG. 11, the display 710 includes "n" scan lines (X0, X1, X2, X3, . . . , $X_{n-2}$, $X_{n-1}$) arrayed at equal intervals in the X-axis direction, "m" data lines (Y0, Y1, Y2, Y3, . . . , $Y_{m-1}$) arrayed at equal intervals in the Y-axis direction, and "m" current supply lines (Y0$i$, Y1$i$, Y2$i$, Y3$i$, . . . , $Y_{m-1}i$) arrayed at equal intervals in the Y-axis direction. One of the plurality of display elements 702 in the display 710 is specified by a scan line and a data line.

Figure 12:
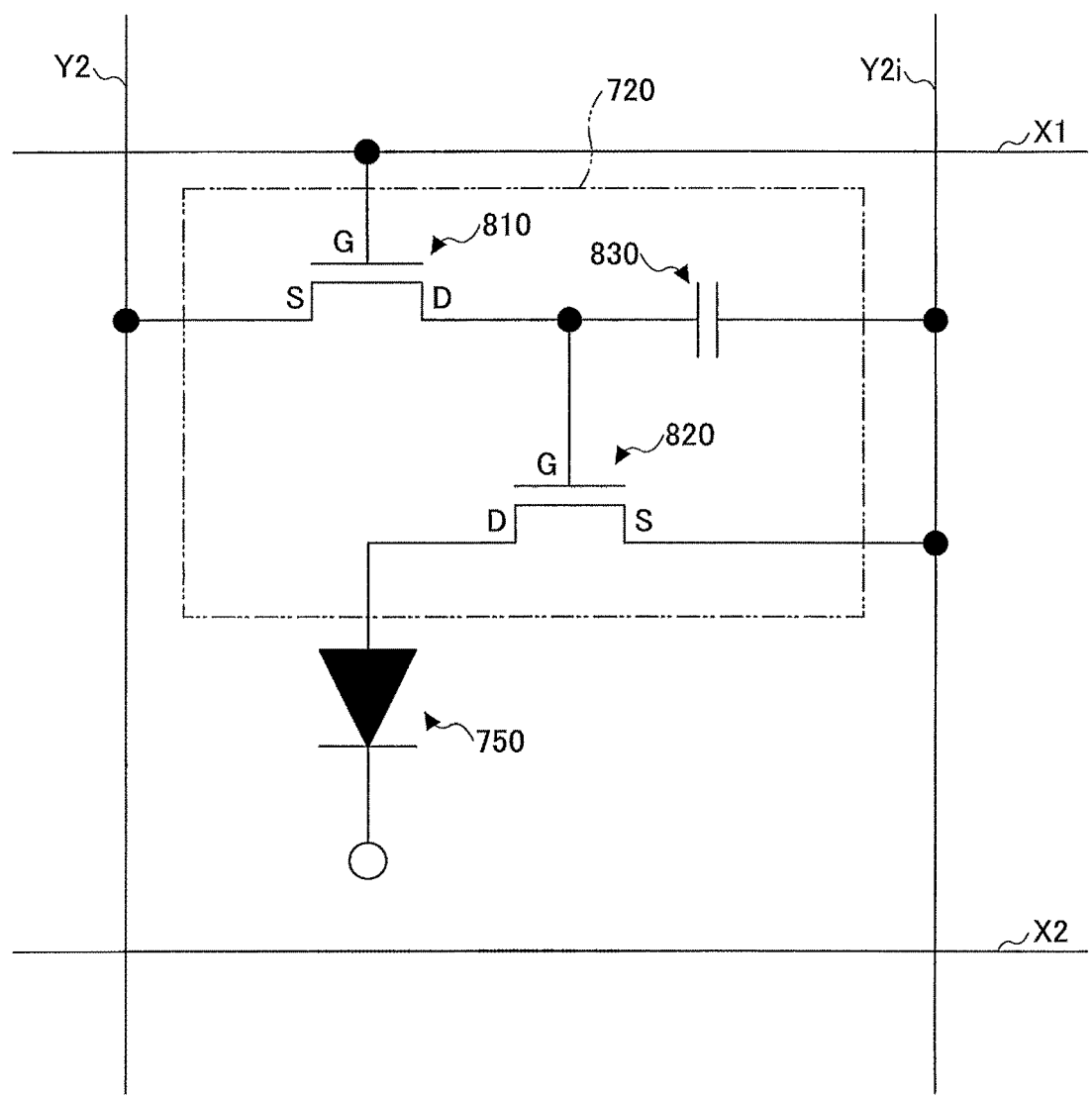
FIG. 12 is a diagram illustrating an example of a display element according to the second embodiment.

Each display element 702 includes an organic EL (electroluminescence) element 750 and a drive circuit 720 configured to activate the organic EL element 750 to emit light. FIG. 12 illustrates an example of the display element 702. Specifically, the display 710 is implemented by an organic EL display of an active matrix system. The display 710 constitutes a 32-inch color display. Note that a size of the display 710 is not limited to this example.

Figure 13:
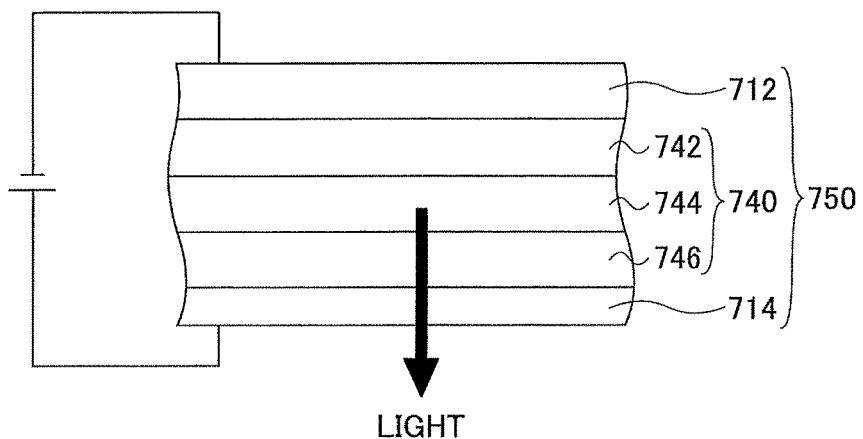
FIG. 13 is a diagram illustrating an organic EL element according to the second embodiment.

FIG. 13 illustrates an example of the organic EL element 750 in FIG. 12. As illustrated in FIG. 13, the organic EL element 750 includes an organic EL thin-film layer 740, a cathode 712, and an anode 714.

For example, the organic EL element 750 is disposed at the side of the field-effect transistor. In this example, the organic EL element 750 and the field-effect transistor may be formed on the same substrate. However, the present disclosure is not limited to this example. Alternatively, the organic EL element 750 may be disposed on the field-effect transistor. In this example, transparency of the gate electrode is required, and a transparent electro-conductive oxide, such as ITO (indium tin oxide), $In_2O_3$, $SnO_2$, ZnO, Ga-added ZnO, Al-added ZnO, or Sb-added $SnO_2$, may be used as a material of the gate electrode.

In the organic EL element 750, Al is used as a material of the cathode 712. Alternatively, any one of Mg—Ag alloy, Al—Li alloy, and ITO may be used as a material of the cathode 712. Further, in the organic EL element 750, ITO is used as a material of the anode 714. Alternatively, Ag—Nd alloy or an electro-conductive oxide, such as $In_2O_3$, $SnO_2$, or ZnO may be used as a material of the anode 714.

As illustrated in FIG. 13, the organic EL thin film layer 740 includes an electron transporting layer 742, a light emitting layer 744, and a hole transporting layer 746. Further, the cathode 712 is connected to the electron transporting layer 742, and the anode 714 is connected to the hole transporting layer 746. When a predetermined voltage is applied between the anode 714 and the cathode 712, the light emitting layer 744 is activated to emit light.

Further, as illustrated in FIG. 12, the drive circuit 720 includes two field-effect transistors 810 and 820, and a capacitor 830. The field-effect transistor 810 functions as a switching element. The gate electrode G of the field-effect transistor 810 is connected to a predetermined scan line, and the source electrode S of the field-effect transistor 810 is connected to a predetermined data line. Further, the drain electrode D of the field-effect transistor 810 is connected to one terminal of the capacitor 830.

The capacitor 830 is configured to store a state of the field-effect transistor 810, i.e., data. The other terminal of the capacitor 830 is connected to a predetermined current supply line.

The field-effect transistor 820 is configured to supply increased electric current to the organic EL element 750. The gate electrode G of the field-effect transistor 820 is connected to the drain electrode D of the field-effect transistor 810. The drain electrode D of the field-effect transistor 820 is connected to the anode 714 of the organic EL element 750, and the source electrode S of the field-effect transistor 820 is connected to the predetermined current supply line.

When the field-effect transistor 810 is set in an "ON" state, the organic EL element 750 is driven by the field-effect transistor 820.

Figure 14:
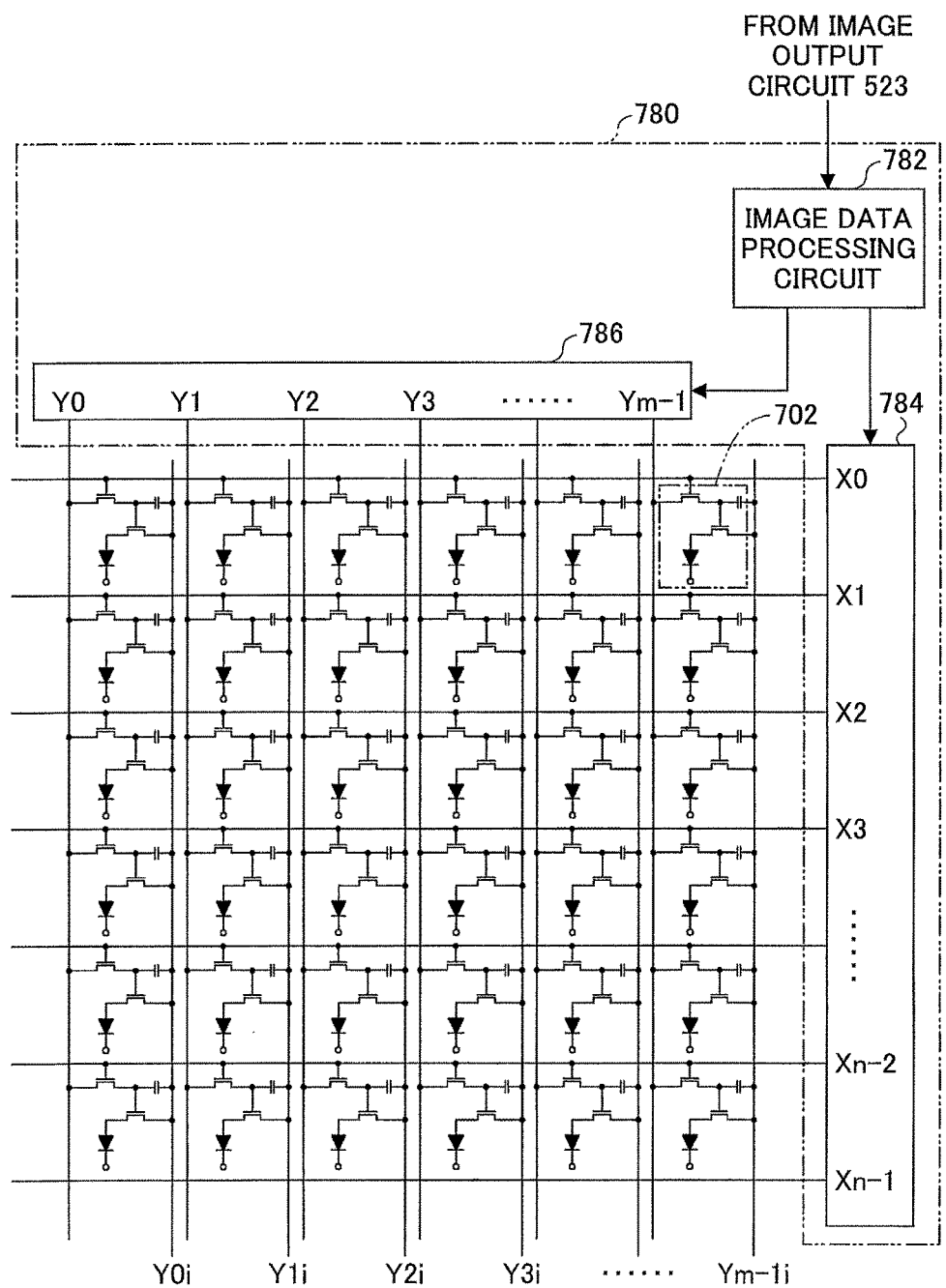
FIG. 14 is a diagram illustrating a display control device according to the second embodiment.

FIG. 14 illustrates an example of the display control device 780 in FIG. 9. As illustrated in FIG. 14, the display control device 780 includes an image data processing circuit 782, a scan line driving circuit 784, and a data line driving circuit 786.

The image data processing circuit 782 is configured to determine luminance of the plurality of display elements 702 in the display 710 based on the output signal of the image output circuit 523. The scan line driving circuit 784 is configured to individually apply voltage to the "n" scan lines according to the instructions from the image data processing circuit 782. The data line driving circuit 786 is configured to individually apply voltage to the "m" data lines according to the instructions from the image data processing circuit 782.

In the television apparatus 500 according to the second embodiment described above, the image decoder 521, the image/OSD superimposing circuit 522, the image output circuit 523, and the OSD drawing circuit 525 constitute the image data generating device.

In the foregoing embodiment, the case where the optical control element is implemented by the organic EL device has been explained. However, the present disclosure is not limited to this embodiment. Alternatively, the optical control element may be implemented by any one of a liquid crystal element, an electrochromic element, an electrophoretic element, and an electrowetting element.

Figure 15:
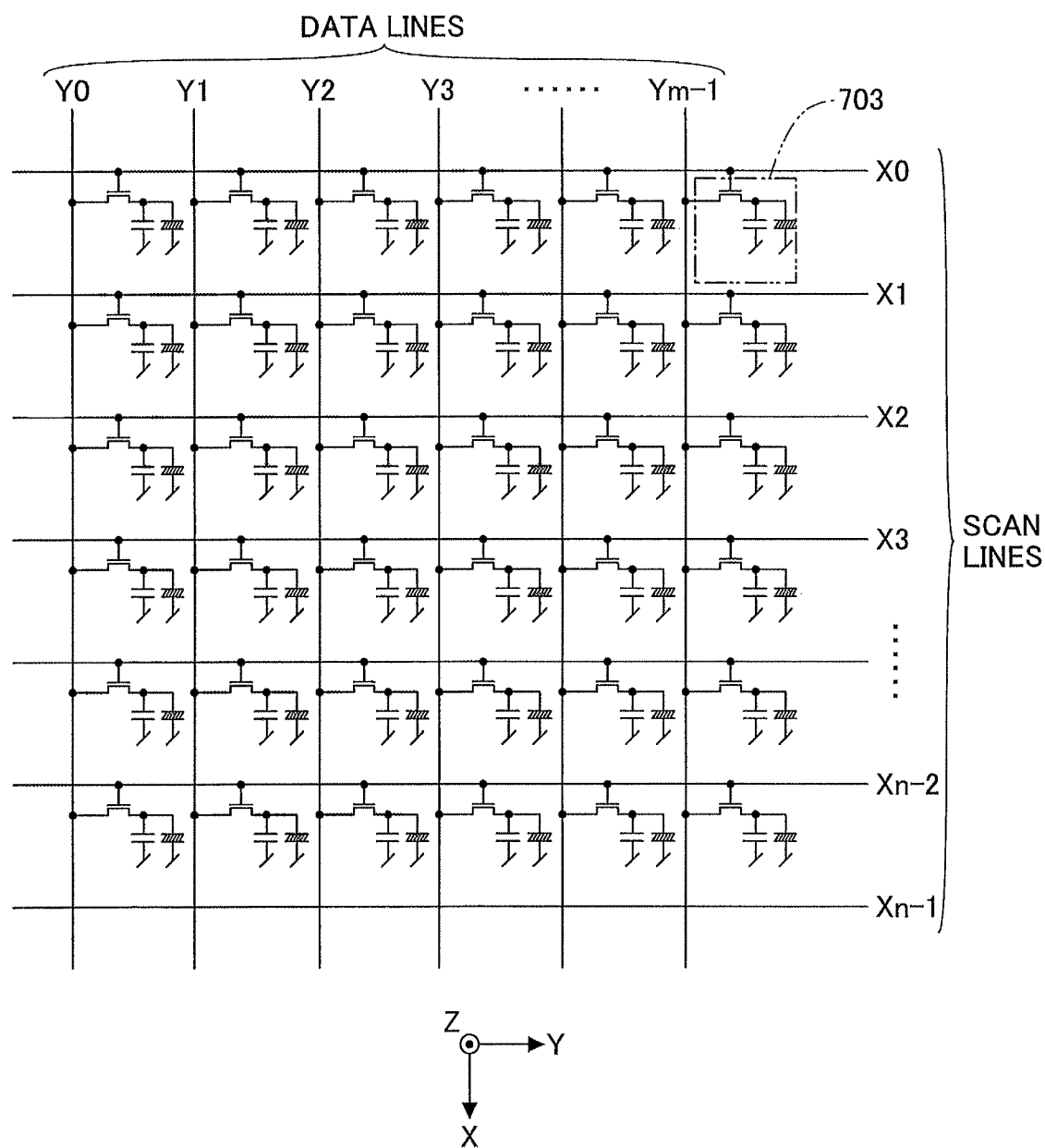
FIG. 15 is a diagram illustrating another example of the display of the display unit.

For example, when the optical control element is implemented by a liquid crystal element, the display 710 is implemented by a liquid crystal display. FIG. 15 illustrates another example of the display 710 of the display unit 700. As illustrated in FIG. 15, the display 710 includes a plurality of display elements 703 arrayed in a matrix formation. In this case, current supply lines connected to the display elements 703 are not required.

Figure 16:
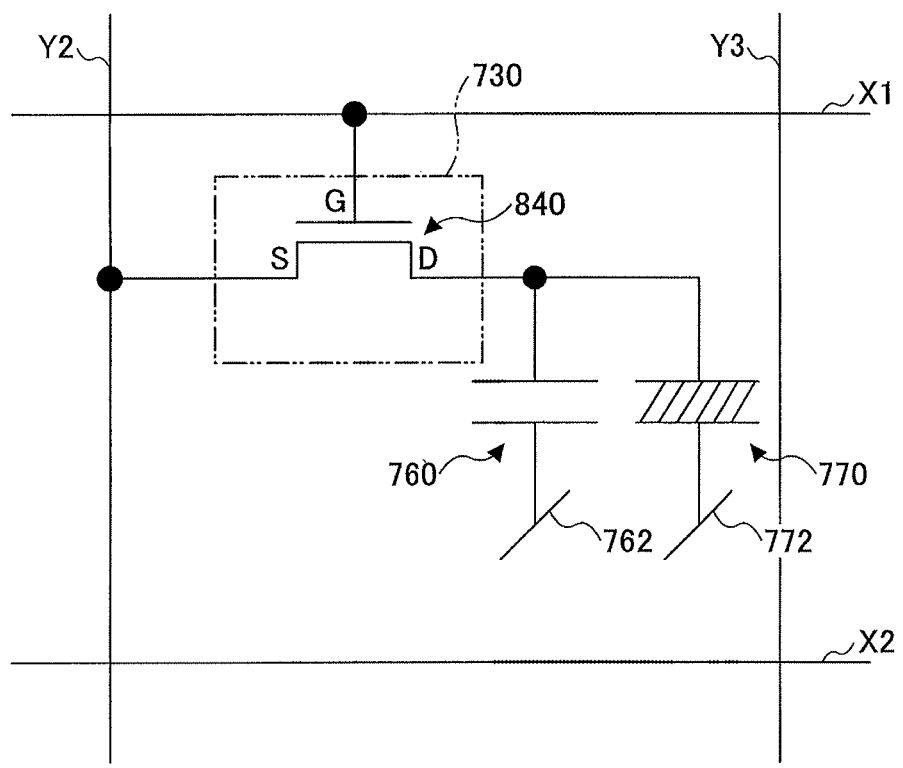
FIG. 16 is a diagram illustrating another example of the display element according to the second embodiment.

FIG. 16 illustrates an example of the display element 703. As illustrated in FIG. 16, the display element 703 includes a drive circuit 730, a capacitor 760, and a liquid crystal element 770. In this case, the drive circuit 730 includes a single field-effect transistor 840 which is essentially the same as the field-effect transistor 810 or 820 illustrated in FIG. 12. In the field-effect transistor 840, the gate electrode G is connected to a predetermined scan line and the source electrode S is connected to a predetermined data line. Further, in the field-effect transistor 840, the drain electrode D is connected to a pixel electrode of the liquid crystal element 770, and the capacitor 760. In FIG. 16, the reference numeral 762 denotes a counter electrode of the capacitor 760 and the reference numeral 772 denotes a counter electrode (common electrode) of the liquid crystal element 770.

The case where the system according to the second embodiment is the television apparatus is explained above. However, the system is not limited to the above example as long as the system includes the image display device 524 as a display device configured to display images and information. For example, the system may be a computer system in which a computer (including a personal computer) is connected to the image display device 524.

Further, the image display device 524 may be used as a display unit in a mobile information device, such as a mobile phone, a portable music player, a portable video player, an electronic book, a personal digital assistant (PDA), a still camera, or a video camera. The image display device 524 may be used as a display unit for various types of information in a transport system, such as a car, an aircraft, a train, and a ship. Further, the image display device 524 may be used as a display unit for various types of information in a measuring device, an analytical device, medical equipment, and advertising media.

The present disclosure is not limited to the above-described embodiments and variations and modifications may be made without departing from the scope of the present disclosure.

What is claimed is:

1. A method for manufacturing a field-effect transistor, comprising:
   (A) forming an oxide semiconductor layer;
   (b) patterning the oxide semiconductor layer to form an active layer;
   (c) forming a conducting film above the active layer;
   (d) patterning the conducting film through an etching process using an etchant, to form an electrode; and
   (e) applying a treatment to the active layer, after the active layer is formed by the patterning in (b) and before the conducting film is patterned in (d), the treatment applied in (e) to the active layer including a heating process to heat the active layer to a temperature higher than a temperature during the forming of the active layer in (b), the treated active layer having a property that an etching rate of the treated active layer is less than an etching rate of the conducting film.

2. The method according to claim 1, wherein the temperature of the heating process is in a range between 200° C. and 500° C.

3. The method according to claim 1, wherein the conducting film used to form the electrode comprises a conducting film containing Al or Mo.

4. The method according to claim 3, wherein the etchant used to form the electrode contains at least one of phosphoric acid, nitric acid, and acetic acid.

5. The method according to claim 3, wherein the conducting film used to form the electrode comprises a multi-layer film in which a conducting film containing Al or Mo is formed as a lowermost layer of the multilayer film.

6. The method according to claim 3, wherein the conducting film used to form the electrode comprises a multi-layer film in which a conducting film containing Al is formed as a lowermost layer of the multilayer film, and a pattern of an upper layer above the lowermost layer of the multilayer film obtained by patterning of the upper layer is used as a mask when etching of the lowermost layer is performed.

7. The method according to claim 6, wherein the etchant used for the etching of the conducting film containing Al as the lowermost layer contains at least an organic alkali solution.

8. The method according to claim 1, wherein the conducting film used to form the electrode comprises a conducting film containing indium oxide.

9. The method according to claim 8, wherein the etchant used for the etching of the conducting layer to form the electrode contains oxalic acid.

10. The method according to claim 8, wherein the conducting film used to form the electrode comprises a multi-layer film in which a conducting film containing indium oxide is formed as a lowermost layer of the multilayer film.

11. The method according to claim 1, wherein the treatment performed on the active layer comprises a laser irradiation process.

12. The method according to claim 1, wherein the oxide semiconductor contains at least one element selected from the group consisting of In, Zn, Sn, and Ti.

13. The method according to claim 12, wherein the oxide semiconductor contains at least one element selected from the group consisting of alkaline earth elements.

14. The method according to claim 12, wherein the oxide semiconductor contains at least one element selected from the group consisting of rare earth elements, Al, Zr, and Hf.

15. The method according to claim 1, wherein the oxide semiconductor comprises an n-type oxide semiconductor which contains indium and at least one element selected from the group consisting of an alkaline earth element, a rare earth element, Al, Zr and Hf, and the n-type oxide semiconductor undergoes substitutional doping with at least one dopant selected from the group consisting of a divalent cation, a trivalent cation, a tetravalent cation, a pentavalent cation, a hexavalent cation, a heptavalent cation, and an octavalent cation, and wherein a valence of the dopant selected from the group consisting of a divalent cation, a trivalent cation, a tetravalent cation, a pentavalent cation, a hexavalent cation, a heptavalent cation, and an octavalent cation is more than a valence of the n-type oxide semiconductor.

* * * * *